United States Patent
Shim et al.

(10) Patent No.: US 11,765,924 B2
(45) Date of Patent: Sep. 19, 2023

(54) LIGHT EMITTING DISPLAY PANEL AND LIGHT EMITTING DISPLAY APPARATUS INCLUDING THE SAME

(71) Applicant: LG Display Co., Ltd., Seoul (KR)

(72) Inventors: Sungbin Shim, Paju-si (KR); Suhyeon Kim, Paju-si (KR); SeJune Kim, Paju-si (KR); Sungbai Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 268 days.

(21) Appl. No.: 17/114,430

(22) Filed: Dec. 7, 2020

(65) Prior Publication Data

US 2021/0193952 A1 Jun. 24, 2021

(30) Foreign Application Priority Data

Dec. 19, 2019 (KR) .................. 10-2019-0171011
Aug. 19, 2020 (KR) .................. 10-2020-0104046

(51) Int. Cl.
*H10K 59/84* (2023.01)
*H10K 59/126* (2023.01)
(Continued)

(52) U.S. Cl.
CPC ......... *H10K 50/813* (2023.02); *H10K 59/126* (2023.02); *H10K 59/84* (2023.02);
(Continued)

(58) Field of Classification Search
CPC ............. H01L 27/3272; H01L 51/5209; H01L 51/5284; H10K 50/81–818;
(Continued)

(56) References Cited

U.S. PATENT DOCUMENTS

| 9,076,746 | B2 | 7/2015 | Chung et al. |
| 10,181,574 | B2 | 1/2019 | Koo et al. |
| 10,355,234 | B2 | 7/2019 | Choi et al. |
| 10,622,578 | B2 | 4/2020 | Koo et al. |
| 10,811,484 | B2 | 10/2020 | Kim et al. |
| 2014/0346444 | A1 | 11/2014 | Chung et al. |

(Continued)

FOREIGN PATENT DOCUMENTS

| CN | 109979970 A | 7/2019 |
| KR | 10-2014-0137704 A | 12/2014 |

(Continued)

OTHER PUBLICATIONS

China National Intellectual Property Administration, Office Action, Chinese Patent Application No. 202011394862.9, dated Jul. 19, 2023, 12 pages.

*Primary Examiner* — Daniel P Shook
(74) *Attorney, Agent, or Firm* — Fenwick & West LLP

(57) ABSTRACT

A light emitting display panel includes a substrate, a pixel driving circuit disposed on the substrate, a planarization layer disposed on the pixel driving circuit, a pixel driving electrode disposed on the planarization layer and electrically connected to the pixel driving circuit, a light emitting layer disposed on the pixel driving electrode, and a common electrode disposed on the light emitting layer. The pixel driving electrode includes a plurality of first electrodes apart from one another and a second electrode covering the first electrodes, and at least one of the second electrode or the plurality of first electrodes is connected to the pixel driving circuit.

20 Claims, 18 Drawing Sheets

(51) Int. Cl.
*H10K 50/813* (2023.01)
*G09G 3/3275* (2016.01)
*G09G 3/3233* (2016.01)
*G09G 3/3266* (2016.01)
*H10K 71/00* (2023.01)

(52) U.S. Cl.
CPC ......... *G09G 3/3233* (2013.01); *G09G 3/3266* (2013.01); *G09G 3/3275* (2013.01); *G09G 2300/0426* (2013.01); *H10K 71/861* (2023.02)

(58) Field of Classification Search
CPC ............... H10K 50/865; H10K 59/126; H10K 59/8051–80518; H10K 59/8792
See application file for complete search history.

(56) References Cited

U.S. PATENT DOCUMENTS

| | | | |
|---|---|---|---|
| 2015/0270327 A1* | 9/2015 | Oh | H01L 51/5209 |
| | | | 257/40 |
| 2018/0190932 A1 | 7/2018 | Koo et al. | |
| 2018/0261794 A1 | 9/2018 | Choi et al. | |
| 2019/0109294 A1 | 4/2019 | Koo et al. | |
| 2019/0206971 A1 | 7/2019 | Kim et al. | |
| 2020/0020757 A1* | 1/2020 | Li | H01L 27/3272 |
| 2020/0235345 A1* | 7/2020 | Xia | H01L 27/1248 |

FOREIGN PATENT DOCUMENTS

| | | |
|---|---|---|
| KR | 10-2016-0031570 A | 3/2016 |
| KR | 10-2018-0078128 A | 7/2018 |
| KR | 10-2019-0048252 A | 5/2019 |

\* cited by examiner

LIGHT EMITTING DISPLAY PANEL AND LIGHT EMITTING DISPLAY APPARATUS INCLUDING THE SAME

CROSS-REFERENCE TO RELATED APPLICATIONS

This application claims the benefit of the Republic of Korea Patent Application No. 10-2019-0171011 filed on Dec. 19, 2019 and Republic of Korea Patent Application No. 10-2020-0104046 filed on Aug. 19, 2020, each of which are hereby incorporated by reference in its entirety.

BACKGROUND

Field of Technology

The present disclosure relates to a structure of a light emitting display panel.

Discussion of the Related Art

In a process of manufacturing a light emitting display panel, particles may be located on a pixel driving electrode of one pixel. Also, when a light emitting layer and a common electrode are deposited on the particles located on the pixel driving electrode, a defect may occur where the pixel driving electrode disposed under the particles is connected to the common electrode.

Such a defect may cause a problem to one pixel, but when the defect is severe, the defect may cause a problem to a plurality of pixels included in the light emitting display panel.

For example, the common electrode is connected to all pixels in common, and due to this, when the common electrode is electrically connected to the pixel driving electrode in one pixel, the quality of the light emitting display panel may be totally reduced.

SUMMARY

Accordingly, the present disclosure is directed to providing a light emitting display panel that substantially obviates one or more problems due to limitations and disadvantages of the related art.

An aspect of the present disclosure is directed to providing a light emitting display panel, including a pixel driving electrode which includes a plurality of first electrodes disposed apart from each other and a second electrode covering the first electrodes, and a light emitting display apparatus including the light emitting display panel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display panel including a substrate, a pixel driving circuit disposed on the substrate, a planarization layer disposed on the pixel driving circuit, a pixel driving electrode disposed on the planarization layer and electrically connected to the pixel driving circuit, a light emitting layer disposed on the pixel driving electrode, and a common electrode disposed on the light emitting layer, wherein the pixel driving electrode includes a plurality of first electrodes apart from one another and a second electrode covering the first electrodes, and at least one of the second electrode and the plurality of first electrodes is connected to the pixel driving circuit.

In another aspect of the present disclosure, there is provided a light emitting display apparatus including the light emitting display panel, a gate driver supplying gate signals to a plurality of gate lines included in the light emitting display panel, a data driver supplying data voltages to a plurality of data lines included in the light emitting display panel, and a controller controlling a function of each of the gate driver and the data driver.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
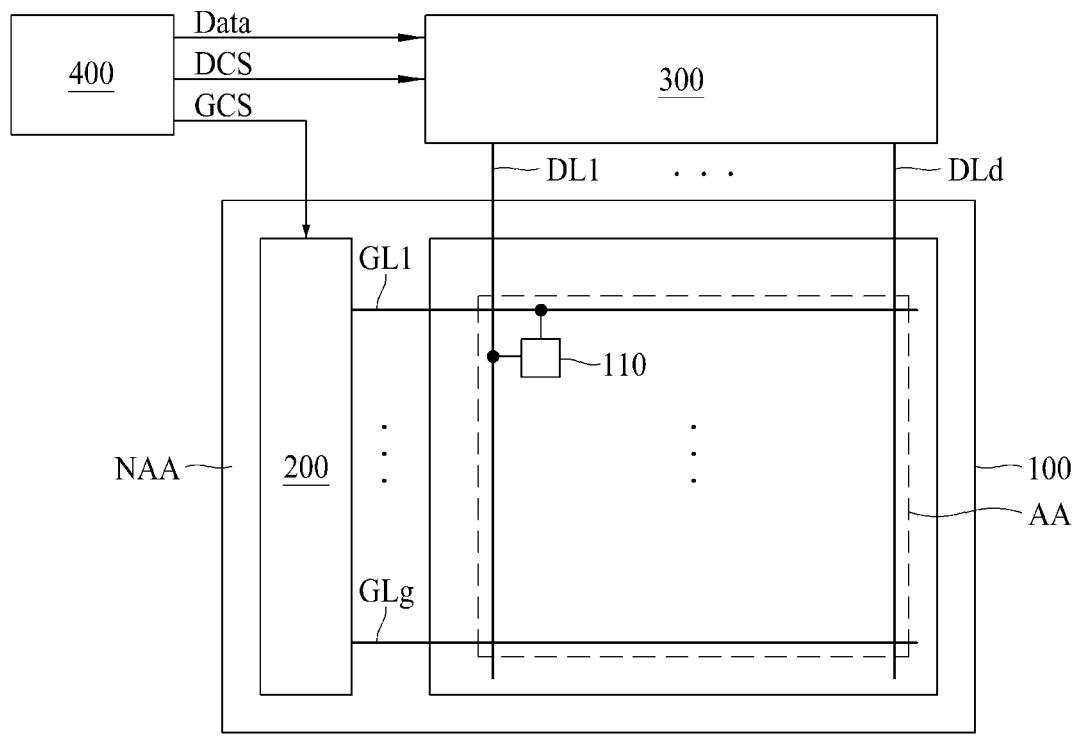
FIG. 1 is an exemplary diagram illustrating a configuration of a light emitting display apparatus according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Figure 2:
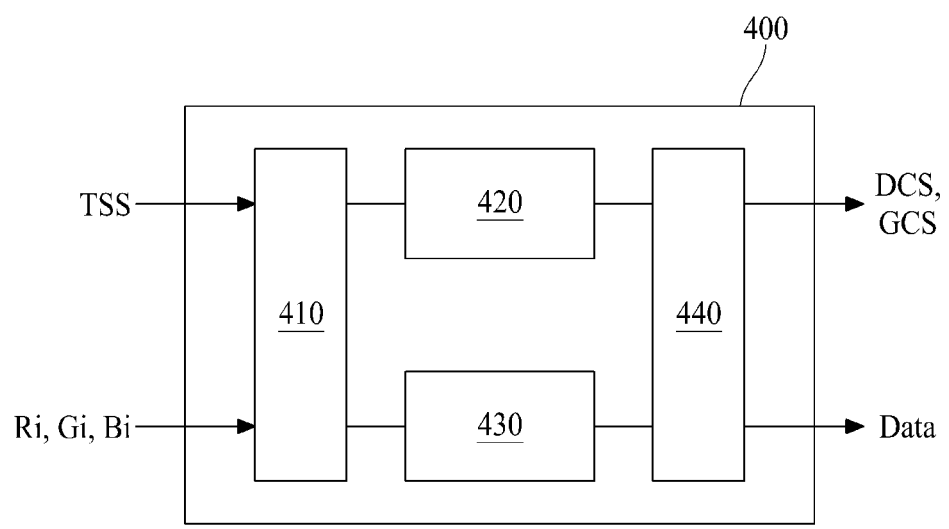
FIG. 2 is an exemplary diagram illustrating a configuration of a controller applied to the light emitting display apparatus according to one embodiment of the present disclosure.

FIG. 1 is an exemplary diagram illustrating a configuration of a light emitting display apparatus according to the present disclosure, and FIG. 2 is an exemplary diagram illustrating a configuration of a controller applied to the light emitting display apparatus according to the present disclosure.

The light emitting display apparatus according to the present disclosure may configure an electronic device. Examples of the electronic device may include smartphones, tablet personal computers (PCs), televisions (TVs), monitors, etc.

The light emitting display apparatus according to the present disclosure, as illustrated in FIG. 1, may include a light emitting display panel 100 which includes a display area AA for displaying an image and a non-display area NAA provided outside the display area AA, a gate driver 200 which supplies a gate signal to a plurality of gate lines GL1 to GLg provided in the light emitting display panel 100, a data driver 300 which respectively supplies data voltages to a plurality of data lines DL1 to DLd provided in the light emitting display panel 100, and a controller 400 which controls driving of the gate driver 200 and the data driver 300.

The controller 400, as illustrated in FIG. 2, a data aligner 430 which realigns pieces of input video data Ri, Gi, and Bi transferred from an external system on the basis of a timing synchronization signal TSS transferred from the external system to supply pieces of realigned image data Data to the data driver 300, a control signal generator 420 which generates a gate control signal GCS and a data control signal DCS on the basis of the timing synchronization signal TSS, an input unit 410 which receives the timing synchronization signal TSS and the input video data Ri, Gi, and Bi transferred from the external system and respectively transfers the input video data Ri, Gi, and Bi and the timing synchronization signal TSS to the data aligner 430 and the control signal generator 420, and an output unit 440 which outputs the image data Data generated by the data aligner 430 and the data control signal DCS generated by the control signal generator 420 to the data driver 300 and outputs the gate control signal GCS to the gate driver 200.

The gate driver 200 may be configured as an integrated circuit (IC), and then, may be mounted in the non-display area NAA or may be directly embedded into the non-display area NAA.

The data driver 300 may be mounted on a chip-on film (COF) attached on the light emitting display panel 100. The COF may be connected to a main board with the controller 400 mounted thereon. In this case, the COF may include a plurality of lines which electrically connect the controller 400, the data driver 300, and the light emitting display panel 100, and to this end, the lines may be electrically connected to the main board and a plurality of pads included in the light emitting display panel 100. The main board may be electrically connected to an external board with the external system mounted thereon. The data driver 300 may be directly mounted on the light emitting display panel 100 and may be electrically connected to the main board.

The external system may perform a function of driving the controller 400 and the electronic device. That is, when the electronic device is a smartphone, the external system may transmit or receive various pieces of sound information, image information, and letter information over a wireless communication network and may transmit image information to the controller 400.

The light emitting display panel 100 may include a plurality of pixels 110 which each include a light emitting device and a pixel driving circuit for driving the light emitting device. Also, in the light emitting display panel 100, a pixel area where each of the pixels 110 is provided may be defined therein, and a plurality of signal lines for transferring a driving signal to the pixel driving circuit may be provided therein.

The signal lines may include various kinds of lines, in addition to the gate lines GL1 to GLg and the data lines DL1 to DLd.

Figure 3:
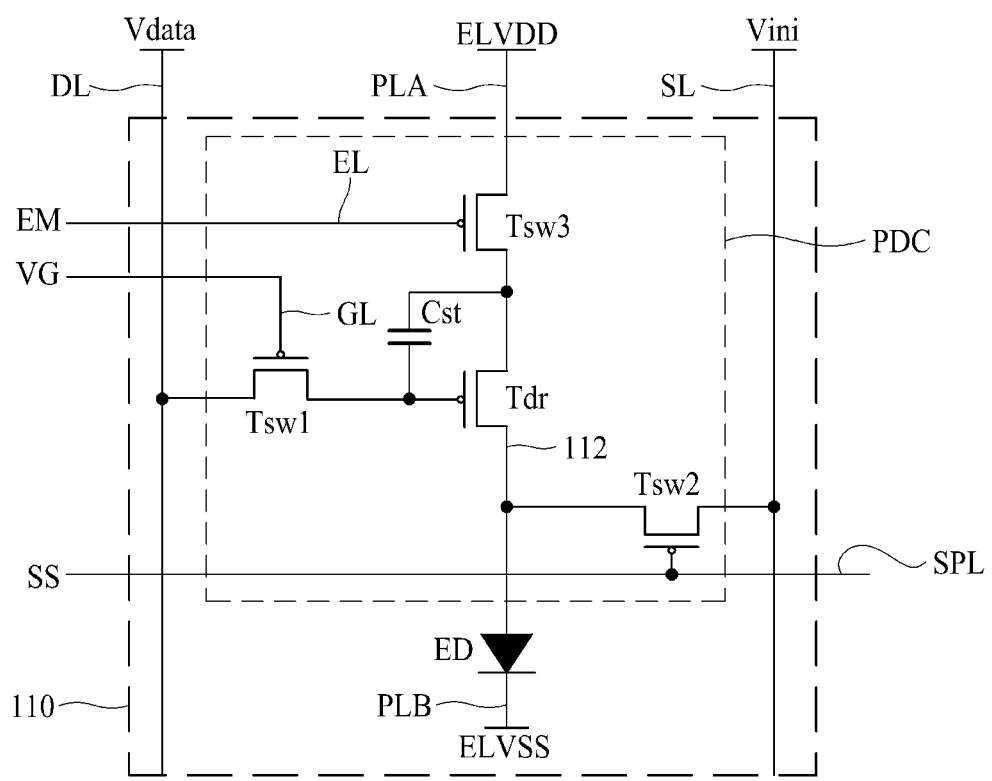
FIG. 3 is an exemplary diagram illustrating a structure of each of a plurality of pixels included in a light emitting display apparatus according to one embodiment of the present disclosure.

FIG. 3 is an exemplary diagram illustrating a structure of each of a plurality of pixels included in a light emitting display apparatus according to the present disclosure.

A plurality of pixels 110, including a light emitting device ED and a pixel driving circuit PDC for driving the light emitting device ED, may be provided in a display area AA of a light emitting display panel 100. Also, in the light emitting display panel 100, a pixel area where each of the pixels 110 is provided may be defined therein, and a plurality of signal lines for transferring a driving signal to the pixel driving circuit PDC may be provided therein.

The plurality of signal lines may include a plurality of gate lines GL, a plurality of data lines DL, a plurality of sensing pulse lines SPL, a plurality of sensing lines SL, a first driving power line PLA, a second driving power line PLB, and a plurality of emission lines EL.

The gate lines GL may be arranged at certain intervals in parallel in a second direction (for example, a widthwise direction) of the light emitting display panel 100.

The sensing pulse lines SPL may be arranged at certain intervals in parallel with the gate lines GL.

The data lines DL may be arranged at certain intervals in parallel in a first direction (for example, a lengthwise direction) of the light emitting display panel 100 to intersect with the gate lines GL and the sensing pulse lines SPL.

The sensing lines SL may be arranged at certain intervals in parallel with the data lines DL.

The first driving power line PLA may be disposed apart from the data line DL and the sensing line SL by a certain interval in parallel. The first driving power line PLA may be connected to a power supply and may supply each pixel 110 with a first driving power EVDD supplied from the power supply.

The second driving power line PLB may supply each pixel 110 with a second driving power EVSS supplied from the power supply.

The emission lines EL may be arranged in parallel with the gate lines GL.

The pixel driving circuit PDC may include a driving transistor Tdr which controls the amount of current flowing in the light emitting device ED, a switching transistor Tsw1 which is connected between the data line DL, the driving transistor Tdr, and the gate line GL, and an emission transistor Tsw3 which controls a current flowing to the driving transistor Tdr. Also, the pixel driving circuit PDC may include a capacitor Cst and a sensing transistor Tsw2.

The switching transistor Tsw1 may be turned on by a gate pulse of a gate signal VG transferred through the gate line GL and may output a data voltage Vdata, supplied through the data line DL, to a gate electrode of the driving transistor Tdr.

The sensing transistor Tsw2 may be turned on by a scan signal SS transferred through the sensing pulse line SPL and may transfer a sensing line voltage Vini, supplied through the sensing line SL, to a source electrode of the driving transistor Tdr or may transfer a voltage, applied to the source electrode of the driving transistor Tdr, to the sensing line SL.

The emission transistor Tsw3 may be turned on by an emission turn-on pulse of an emission signal EM transferred through the emission line EL and may allow a current to flow to the light emitting device ED through the driving transistor Tdr, or may be turned off by an emission turn-off signal of the emission signal EM and may allow a current not to flow to the light emitting device ED.

The capacitor Cst may be provided between the gate electrode and the source electrode of the driving transistor Tdr and may be charged with a data voltage transferred through the switching transistor Tsw1, and the driving transistor Tdr may be driven by a voltage charged into the capacitor Cst.

That is, the driving transistor Tdr may be turned on by the voltage charged into the capacitor Cst and may control the amount of data current flowing to the light emitting device ED through the first driving power line PLA.

The light emitting device ED may emit light with the data current transferred from the driving transistor Tdr to irradiate the light having luminance corresponding to the data current.

A structure of the pixel driving circuit PDC may be implemented to have various structures, in addition to a structure illustrated in FIG. 3.

For example, in FIG. 3, the transistors are provided as a P type, illustrated, and the pixel driving circuit PDC including four transistors is illustrated. However, the present disclosure is not limited thereto, and in other embodiments, the pixel driving circuit PDC may include two transistors, three transistors, or five transistors.

That is, in order to compensate for a variation of a threshold voltage or mobility caused by the degradation in the driving transistor Tdr, the pixel driving circuit PDC may further include at least one transistor, in addition to the sensing transistor Tsw2 and the driving transistor Tdr.

To provide an additional description, the pixel driving circuit PDC may include at least two transistors, for performing internal compensation or external compensation.

Here, the internal compensation may denote a method which controls a voltage at the gate electrode of the driving transistor Tdr so that a current supplied to the light emitting device ED is not affected by a variation of the threshold voltage or a variation of mobility even when the threshold voltage or mobility of the driving transistor Tdr varies due to the degradation in the driving transistor Tdr.

The external compensation may denote a method which checks the amount of variation of the threshold voltage or mobility of the driving transistor Tdr caused by the degradation in the driving transistor Tdr and varies a level of the data voltage Vdata supplied through the data line DL on the basis of the amount of variation of the threshold voltage or mobility.

Figure 4:
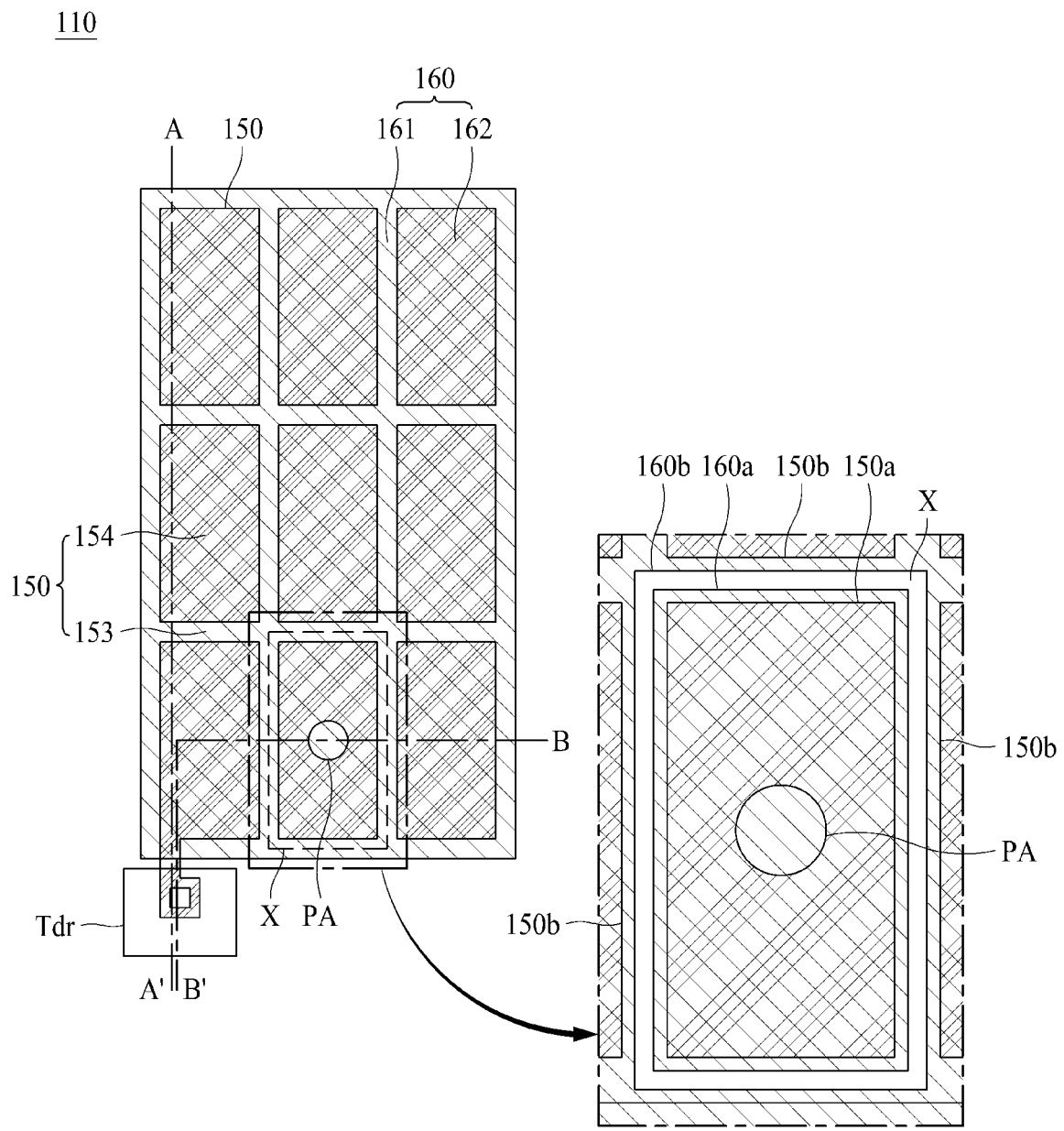
FIG. 4 is an exemplary diagram illustrating a plane of a pixel driving electrode of a pixel included in a light emitting display panel according to one embodiment of the present disclosure.
Figure 5:
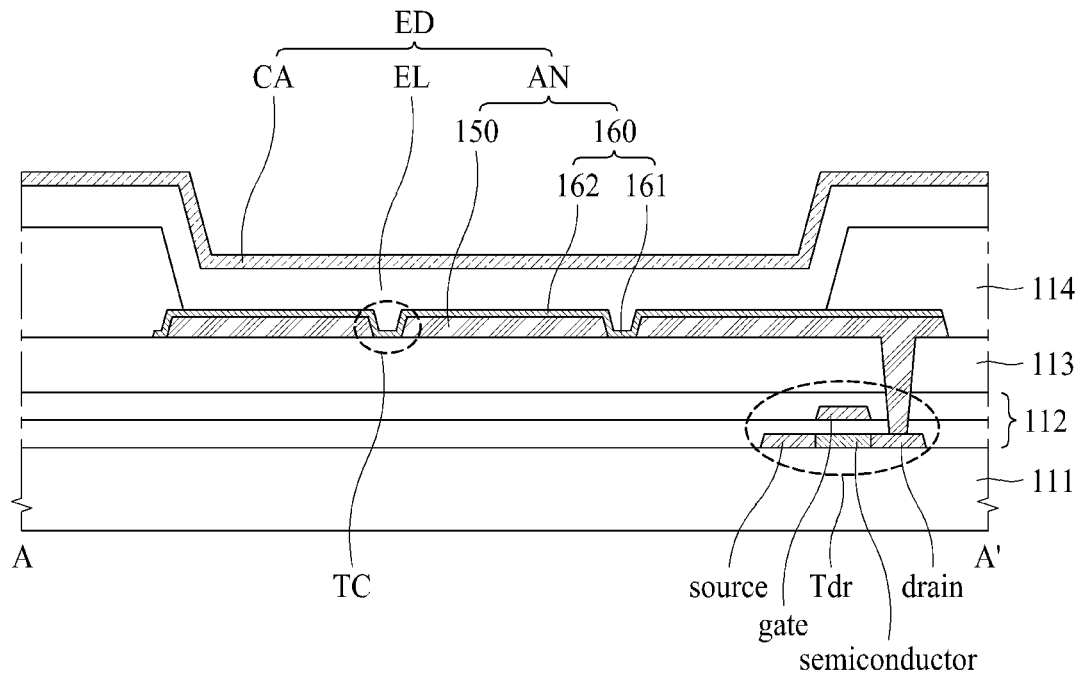
FIG. 5 is an exemplary diagram illustrating a cross-sectional surface taken along line A-A' illustrated in FIG. 4 according to one embodiment of the present disclosure.

FIG. 4 is an exemplary diagram illustrating a plane of a pixel driving electrode of a pixel included in a light emitting display panel 100 according to the present disclosure, and FIG. 5 is an exemplary diagram illustrating a cross-sectional surface taken along line A-A' illustrated in FIG. 4. Particularly, FIGS. 4 and 5 illustrate a pixel driving electrode AN included in one pixel.

The light emitting display panel 100 according to the present disclosure, as illustrated in FIGS. 3 to 5, may include a substrate 111, a pixel driving circuit PDC which includes a driving transistor Tdr disposed on the substrate 111, a planarization layer 113 which is disposed on the pixel driving circuit PDC, a pixel driving electrode AN which is disposed on the planarization layer 113 and is electrically connected to the driving transistor Tdr of the pixel driving circuit PDC, a light emitting layer EL which is disposed on the pixel driving electrode AN, and a common electrode CA which is disposed on the light emitting layer EL.

The substrate 111 may include a plastic material or a glass material. The substrate 111 may have a flat tetragonal shape, a tetragonal shape where each corner portion thereof is rounded at a certain curvature radius, or a non-tetragonal shape including at least six sides. Here, the substrate 111 having a non-tetragonal shape may include at least one protrusion portion or at least one notch portion.

The substrate 111 may include an opaque or colored polyimide material. For example, a substrate including a polyimide material may be formed by curing a polyimide resin which is coated to have a certain thickness on a front surface of a release layer provided on a carrier substrate which is relatively thick. In this case, the carrier substrate may be detached from the substrate by releasing the release layer through a laser release process.

A back plate may be further provided on a rear surface of the substrate 111. The back plate may maintain the substrate 111 in a flat state. The back plate may include a plastic material, and for example, may include polyethylene terephthalate. The back plate may be laminated on a rear surface of a substrate detached from a carrier substrate.

The substrate 111 may be a flexible glass substrate. For example, the substrate 111 may be a thin glass substrate having a thickness of 100 μm or less, or may be a carrier glass substrate which is etched to have a thickness of 100 μm or less through a substrate etching process performed after a process of manufacturing the light emitting display panel 100 is completed.

The pixel driving circuit PDC may be disposed on a top surface of the substrate 111. The pixel driving circuit PDC may have a structure described above with reference to FIG. 3, and moreover, may be configured as various types.

The pixel driving circuit PDC may include the driving transistor Tdr connected to the pixel driving electrode AN. In FIG. 5, the driving transistor Tdr among various transistors and capacitors included in the pixel driving circuit PDC is illustrated.

The pixel driving circuit PDC, as illustrated in FIG. 5, may be provided on the substrate 111, but it not limited thereto and at least one buffer may be further disposed between the pixel driving circuit PDC and the substrate 111. The buffer may include various kinds of organic layers or inorganic layers.

The driving transistor Tdr may include a semiconductor layer, a source electrode, a drain electrode, and a gate electrode. Also, the driving transistor Tdr may further include at least one insulation layer 112.

The planarization layer 113 may be disposed on the pixel driving circuit PDC. The planarization layer 113 may be disposed on the substrate 111 to cover the pixel driving circuit PDC, and thus, a flat surface may be provided on the pixel driving circuit PDC.

A light emitting device ED may be disposed on the planarization layer 113. The light emitting device ED may include the pixel driving electrode AN electrically connected to the driving transistor Tdr, the light emitting layer EL disposed on the pixel driving electrode AN, and the common electrode CA disposed on the light emitting layer EL.

The pixel driving electrode AN may be an anode. The pixel driving electrode AN may be disposed in an opening region of a pixel 110 and may be electrically connected to the driving transistor Tdr included in the pixel driving circuit PDC.

The pixel driving electrode AN may include a metal material which is high in reflectance. For example, the pixel driving electrode AN may include a multi-layer structure such as a stacked structure (Ti/Al/Ti) of aluminum (Al) and titanium (Ti), a stacked structure (ITO/Al/ITO) of Al and indium tin oxide (ITO), an APC alloy (Ag/Pd/Cu) of silver (Ag), palladium (Pd), and copper (Cu), or a stacked structure (ITO/APC/ITO) of an APC alloy and ITO, or may include a single-layer structure including one material or two or more alloy materials selected from among Ag, Al, molybdenum (Mo), gold (Au), magnesium (Mg), calcium (Ca), and barium (Ba).

An edge of the pixel driving electrode AN, as illustrated in FIG. 5, may be covered by a bank 114. The bank 114 may be disposed in a region, other than an opening region, of the pixel 110 to overlap the edge of the pixel driving electrode AN. Accordingly, the opening region of the pixel 110 may be defined by an opening portion of the bank 114.

Based on the bank 114, the opening region of the pixel 110 may be defined as a pentile structure or a stripe structure.

The light emitting layer EL may be formed in all of a display area AA of the substrate 111 to cover the pixel driving electrode AN and the bank 114.

The light emitting layer EL may include two or more light emitting parts for emitting white light. For example, the light emitting layer EL may include a first light emitting part and a second light emitting part for emitting white light on the basis of a combination of first light and second light. Here, the first light emitting part may emit the first light and may include one of a blue light emitting part, a green light emitting part, a red light emitting part, a yellow light emitting part, and a yellowish green light emitting part. The second light emitting part may include a light emitting part, emitting the second light having a complementary color relationship with the first light, among the blue light emitting part, the green light emitting part, the red light emitting part, the yellow light emitting part, and the yellowish green light emitting part.

The light emitting layer EL may include one of the blue light emitting part, the green light emitting part, and the red light emitting part, for emitting colored light corresponding to a color set in the pixel 110.

The light emitting layer EL may include one of an organic light emitting layer, an inorganic light emitting layer, and a quantum dot light emitting layer, or may include a stacked or combination structure of an organic light emitting layer (or an inorganic light emitting layer) and a quantum dot light emitting layer.

The common electrode CA may be formed to be electrically connected to the light emitting layer EL. The common electrode CA may be formed in all of the display area AA of the substrate 111 so as to be connected to a plurality of light emitting layers EL provided in each pixel 110.

The common electrode CA may include a transparent conductive material or a semi transmissive conductive material for transmitting light. When the common electrode CA includes a semi transmissive conductive material, the emission efficiency of light emitted from the light emitting device ED through a micro-cavity may increase. For example, the semi transmissive conductive material may include Mg, Ag, or an alloy of Mg and Ag. A capping layer for adjusting a refractive index of the light emitted from the light emitting device ED to enhance the emission efficiency of the light may be further formed on the common electrode CA.

An encapsulation layer may be disposed on the common electrode CA.

The pixel driving electrode AN, as illustrated in FIGS. 4 and 5, may include a plurality of first electrodes 150 apart from one another and a second electrode 160 which covers the first electrodes 150.

At least one of the second electrode 160 and the first electrodes 150 may be connected to the pixel driving circuit PDC.

For example, referring to FIG. 4, one of the first electrodes 150 may be directly connected to the driving transistor Tdr. However, the present disclosure is not limited thereto. For example, the second electrode 160 may be directly connected to the driving transistor Tdr.

Hereinafter, for convenience of description, a light emitting display panel 100 where one of the first electrodes 150 is directly connected to the driving transistor Tdr will be described as an example of the present disclosure.

A shape of each of the first electrodes 150, as illustrated in FIG. 4, may be tetragonal. However, the present disclosure is not limited thereto, and in other embodiments, each of the first electrodes 150 may have various shapes such as a circular shape and a hexagonal shape.

The first electrodes 150 may be provided on the planarization layer 113 and may be disposed apart from one another.

As described above, one of the first electrodes 150 may be electrically connected to the driving transistor Tdr.

The first electrodes 150 may perform a function of a reflector which reflects light, emitted from the light emitting layer EL, in a direction toward the common electrode CA. Therefore, the first electrodes 150 may include a metal material which is high in reflectance, and for example, may include a multi-layer structure such as a stacked structure (Ti/Al/Ti) of Al and Ti or an APC alloy (Ag/Pd/Cu) or may include one material or two or more alloy materials selected from among Ag, Al, Mo, Au, Mg, Ca, and Ba.

However, the first electrodes 150 may include transparent metal such as ITO and indium zinc oxide (IZO).

The second electrode 160 may be included in the pixel to cover all of the first electrodes 150. Accordingly, the second electrode 160 may be electrically connected to the driving transistor Tdr.

The first electrodes 150, which are apart from one another and are electrically insulated from one another, may be electrically connected to one another by the second electrode 160.

The first electrodes 150 disposed apart from one another on the planarization layer 113 may be electrically connected to one another through the second electrode 160. Accordingly, the first electrodes 150 disposed apart from one another may be electrically connected to the driving transistor Tdr through the second electrode 160.

The second electrode 160 may include a $2\text{-}1^{th}$ electrode 161 provided on the planarization layer 113 and a $2\text{-}2^{th}$ electrode 162 provided on the first electrode 150.

The $2\text{-}2^{th}$ electrode 162 may be disposed to overlap the first electrode 150, and the $2\text{-}1^{th}$ electrode 161 may be disposed between the first electrodes 150. The $2\text{-}1^{th}$ electrode 161 and the 2-2th electrode 162 may be connected to each other at a side surface of the first electrode 150.

The second electrode 160 may also include the same material as that of the first electrode 150, but is not limited thereto and may include transparent metal such as ITO or IZO. That is, the second electrode 160 may include at least one of opaque metal, semi-transparent metal, and transparent metal.

Referring to FIG. 5, a trench TC may be formed between the first electrodes 150 disposed apart from one another. The $2\text{-}1^{th}$ electrode 161 may be disposed to correspond to the trench TC.

The $2\text{-}2^{th}$ electrode 161 provided on the first electrode 150 and the $2\text{-}1^{th}$ electrode 161 provided in the trench TC may be connected to each other at a side surface of the first electrode 150.

When a particle is not in the pixel 110 (particularly, the light emitting device ED), a cross-sectional surface of the light emitting display panel 100 may have a structure illustrated in FIG. 5.

Figure 6:
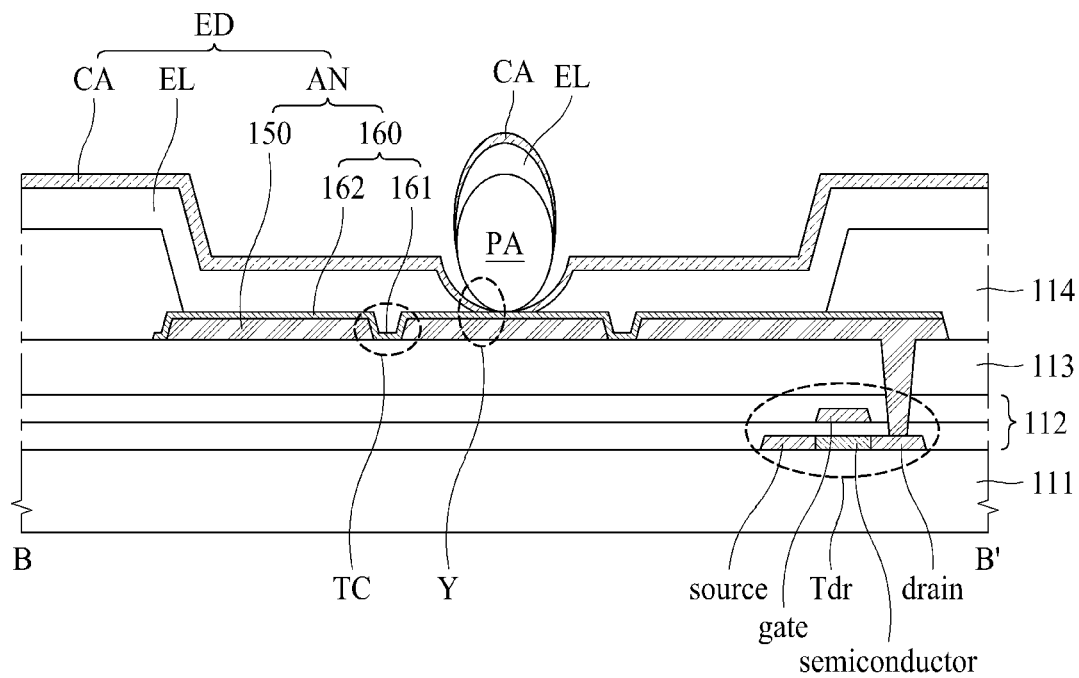
FIG. 6 is an exemplary diagram illustrating a cross-sectional surface of a light emitting display panel according to one embodiment of the present disclosure in a manufacturing process.
Figure 7A:
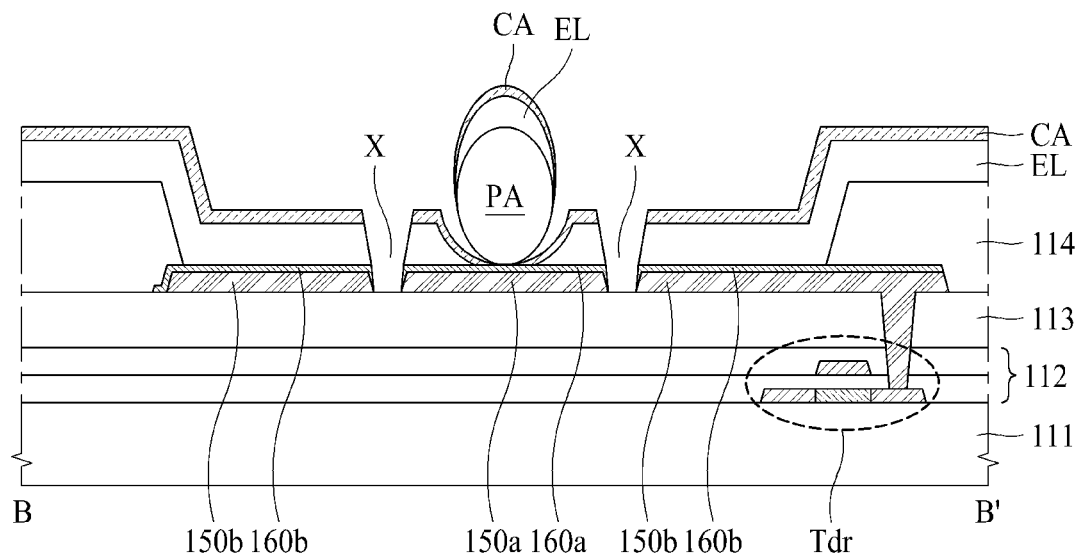
FIGS. 7A to 7C are exemplary diagrams illustrating a cross-sectional surface taken along line B-B' of FIG. 4 according to one embodiment of the present disclosure.
Figure 7B:
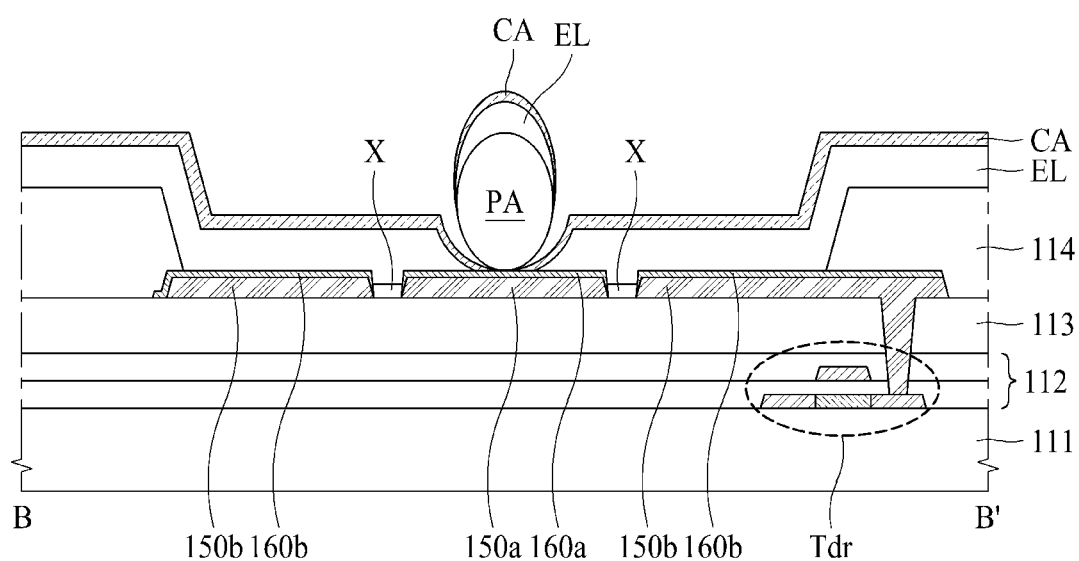
Figure 7C:
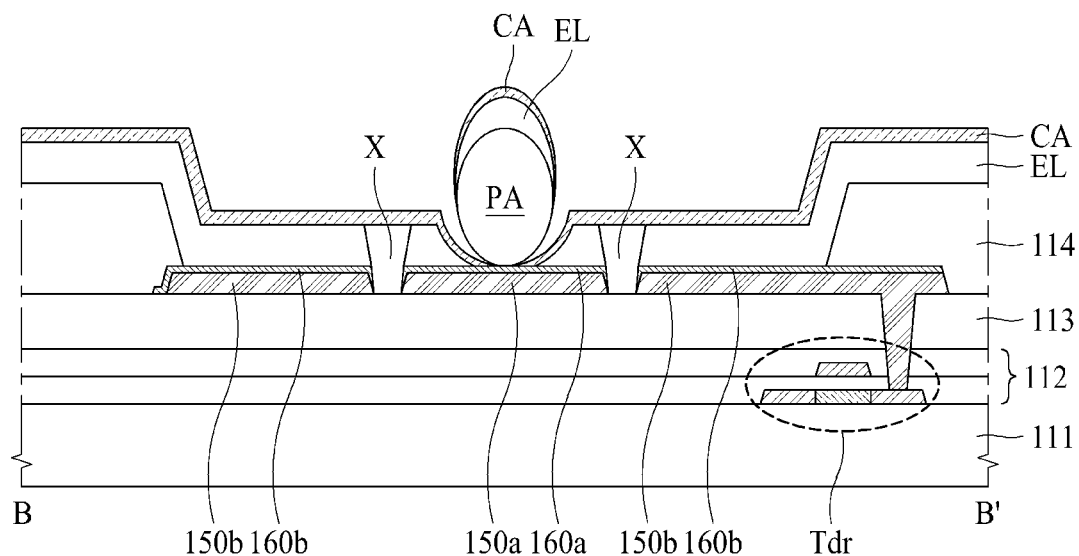

FIG. 6 is an exemplary diagram illustrating a cross-sectional surface of a light emitting display panel according to the present disclosure in a manufacturing process, and particularly, illustrates a cross-sectional surface including a particle. FIGS. 7A to 7C are exemplary diagrams illustrating a cross-sectional surface taken along line B-B' of FIG. 4.

In a process of manufacturing the light emitting display panel 100, a particle PA may be provided on the light emitting display panel 100 due to several causes.

When the particle PA is provided on the light emitting display panel 100, various defects may occur due to the particle PA.

When the particle PA is provided on a top surface of the pixel driving electrode AN in manufacturing the light emitting display panel 100, a defect may occur where the pixel driving electrode AN with the particle PA provided thereon is electrically connected to the common electrode CA. Also, the defect may largely decrease the quality of the light emitting display panel 100.

For example, as illustrated in FIG. 6, in a state where the particle PA is provided on the pixel driving electrode AN, when the light emitting layer EL is deposited on the pixel driving electrode AN, the light emitting layer EL may not be deposited on a lower region Y of the particle PA. Accordingly, the second electrode 160 of the pixel driving electrode AN may be exposed at the lower region Y of the particle PA. In this case, the light emitting layer EL may be deposited on a top surface of the particle PA.

In a state where the second electrode 160 is exposed at the lower region Y of the particle PA, when the common electrode CA is deposited on a top surface of the light emitting layer EL, the common electrode CA may be electrically connected to the second electrode 160 at the lower region of the particle PA.

When the second electrode 160 included in one pixel 110 is electrically connected to the common electrode CA connected to all pixels 110 in common, as illustrated in FIG. 6, a defect may occur in other pixels 110 as well as the pixel 110 including the second electrode 160.

Therefore, when a defect illustrated in FIG. 6 occurs, a repair process or an aging process illustrated in FIGS. 7A to 7C may be performed.

The trench TC which is recessed may be formed between the first electrodes 150, and the first electrodes 150 may be electrically connected to each other by the 2-1$^{th}$ electrode 161 provided in the trench TC. Also, a thickness of the 2-1$^{th}$ electrode 161 may be less than that of the first electrode 150.

Because a thickness of the 2-1$^{th}$ electrode 161 is relatively less than that of the first electrode 150, the 2-1$^{th}$ electrode 161 may be easily removed from the trench TC.

For example, as illustrated in FIGS. 4 and 7A, a through hole X passing through the common electrode CA, the light emitting layer EL, and the 2-1$^{th}$ electrode 161 may be formed by performing an etching process on the trench TC near a first electrode (hereinafter simply referred to as a first particle electrode 150a) with the particle PA provided thereon. The planarization layer 113 may be exposed through the through hole X.

The through hole X may be formed by the above-described etching process (for example, a wet etching process, a dry etching process, or a dry and wet etching process).

Moreover, the through hole X may be formed by a cutting process using a laser.

Moreover, the through hole X may be formed by a heating process.

For example, as illustrated in FIG. 6, in a case where a dark spot occurs due to the short circuit of the pixel driving electrode AN and the common electrode CA, when a voltage is applied, Joule's heat may locally occur near the particle PA. When heat caused by Joule's heat is diffused to a periphery of the particle PA, the heat may concentrate on the 2-1$^{th}$ electrode 161 which is disposed in the trench TC and has a relatively thin thickness, and thus, melting may occur.

Accordingly, as illustrated in FIGS. 7A to 7C, the 2-1$^{th}$ electrode 161 may be disconnected in the trench TC.

In this case, as illustrated in FIG. 7A, all of the 2-1$^{th}$ electrode 161, the light emitting layer EL, and the common electrode CA may be disconnected due to Joule's heat. Alternatively, as illustrated in FIG. 7B, only the 2-1$^{th}$ electrode 161 may be disconnected. Alternatively, as illustrated in FIG. 7C, only the 2-1$^{th}$ electrode 161 and the light emitting layer EL may be disconnected.

Therefore, at least one first electrode (hereinafter simply referred to as a first particle electrode 150a) of the first electrodes 150 may be disconnected from the second electrode 160 disposed between other first electrodes (hereinafter simply referred to as a first normal electrode 150b) surrounding the at least one first electrode (the first particle electrode 150a). For example, the 2-1$^{th}$ electrode 161 corresponding to a region with the particle PA provided therein may be divided from the second electrode 160. Referring to FIG. 4, a second electrode (hereinafter simply referred to as a second particle electrode 160a) of a region corresponding to the first particle electrode 150a may be disconnected from a portion (hereinafter simply referred to as a second normal electrode 160b), other than the second particle electrode 160a, of the second electrode 160.

Although the 2-1$^{th}$ electrode 161 corresponding to a region with the particle PA provided therein is divided from the second electrode 160, first electrodes 150 corresponding to a region where the particle PA is not provided may be covered by the second electrode 160, and thus, the same pixel driving voltage may be supplied to the first electrodes 150. Therefore, because only a first electrode 150 corresponding to the region with the particle PA provided therein is divided from the first electrodes 150, the pixel driving voltage may not be supplied thereto and may be supplied to the first electrodes 150 corresponding to the region where the particle PA is not provided. Accordingly, even when the particle PA is provided in a manufacturing process, a whole pixel may not be blackened, and a region where the particle PA is not provided may be used as a pixel.

For example, the second particle electrode 160a may be electrically disconnected from the second normal electrode 160b, and the second normal electrode 160b may be electrically connected to first normal electrodes 150b including a first normal electrode connected to the driving transistor Tdr. Also, the first particle electrode 150a and the second particle electrode 160a may not be electrically connected to the driving transistor Tdr.

Therefore, light may not be emitted from only a portion corresponding to the first particle electrode 150a, and light may be emitted from other portions corresponding to the first normal electrodes 150b. Accordingly, the reduction in luminance may be reduced in one pixel.

To provide an additional description, a first electrode with the particle PA provided thereon among the first electrodes 150 may be referred to as a first particle electrode 150a, and first electrodes, other than the first particle electrode 150a, of the first electrodes 150 may be referred to as first normal electrodes 150b.

In this case, the first particle electrode 150a may be electrically disconnected from the first normal electrodes 150b.

Moreover, a portion, disposed at an upper end of the first particle electrode 150a, of the second electrode 160 may be referred to as a second particle electrode 160a, and the other portion, except the second particle electrode 160a, of the second electrode 160 may be referred to as a second normal electrode 160b.

In this case, the second particle electrode 160a may be disconnected from the second normal electrode 160b, between the first particle electrode 150a and the first normal electrodes 150b.

The second normal electrode 160b and one of the first normal electrodes 150b may be connected to the driving transistor Tdr and the first normal electrodes 150b may be covered by the second normal electrode 160b, and thus, light may not be emitted from only a portion corresponding to the first particle electrode 150a and light may be emitted from the other portions corresponding to the first normal electrodes 150b. Accordingly, a reduction in luminance may be reduced in one pixel.

Figure 8:
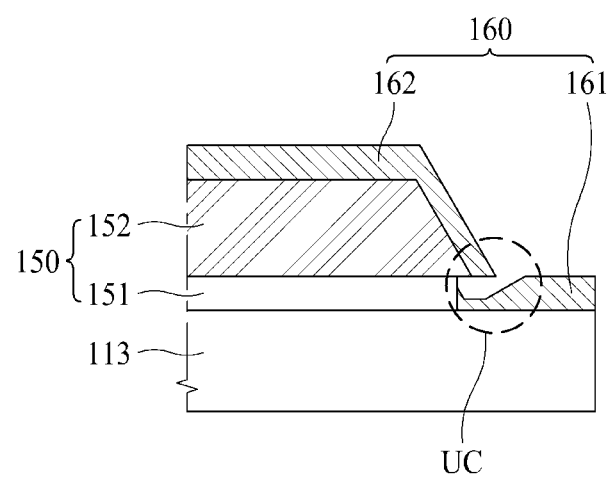
FIG. 8 is an exemplary diagram illustrating a connection structure between a $2\text{-}1^{th}$ electrode and a $2\text{-}2^{th}$ electrode in a light emitting display panel according to one embodiment of the present disclosure.

FIG. 8 is an exemplary diagram illustrating a connection structure between a $2\text{-}1^{th}$ electrode and a $2\text{-}2^{th}$ electrode in a light emitting display panel according to the present disclosure, and FIG. 9 is an exemplary diagram illustrating a method of forming an undercut region in a light emitting display panel according to the present disclosure. Particularly, FIG. 8 illustrates a $2\text{-}1^{th}$ electrode 161 and a $2\text{-}2^{th}$ electrode 162 which are connected to each other through a first electrode 150. Hereinafter, descriptions which are the same as or similar to descriptions given above with reference to FIGS. 1 to 7C are omitted or will be briefly given.

The $2\text{-}1^{th}$ electrode 161 and the $2\text{-}2^{th}$ electrode 162, as illustrated in FIG. 5, may be connected to each other at a side surface of the first electrode 150.

However, as illustrated in FIG. 8, the $2\text{-}1^{th}$ electrode 161 and the $2\text{-}2^{th}$ electrode 162 may be connected to each other through the first electrode 150.

To this end, as illustrated in FIG. 8, each of a plurality of first electrodes 150 may include a $1\text{-}1^{th}$ electrode 151 provided on a planarization layer 113 and a $1\text{-}2^{th}$ electrode 152 provided at an upper end of the $1\text{-}1^{th}$ electrode 151. In this case, the second electrodes 160 may include a $2\text{-}1^{th}$ electrode 161 provided on the planarization layer 113 and a $2\text{-}2^{th}$ electrode 162 provided at an upper end of the $1\text{-}2^{th}$ electrode 152. The $1\text{-}1^{th}$ electrode 151 may include Mo, and the $1\text{-}2^{th}$ electrode 152 may include ITO. In addition, the $1\text{-}1^{th}$ electrode 151 and the $1\text{-}2^{th}$ electrode 152 may include various metal materials.

In this case, the $2\text{-}1^{th}$ electrode 161 and the second $2\text{-}2^{th}$ electrode 162 may be connected to each other through the first electrode 150.

That is, the $2\text{-}1^{th}$ electrode 161 may be connected to the $1\text{-}1^{th}$ electrode 151, and the $2\text{-}2^{th}$ electrode 162 may be connected to the $1\text{-}2^{th}$ electrode 152. Therefore, the $2\text{-}1^{th}$ electrode 161 and the second $2\text{-}2^{th}$ electrode 162 may be connected to each other through $1\text{-}1^{th}$ electrode 151 and the $1\text{-}2^{th}$ electrode 152.

Particularly, a side surface of the $2\text{-}1^{th}$ electrode 161 may be connected to a side surface of the $1\text{-}1^{th}$ electrode 151.

Therefore, as illustrated in FIG. 8, an undercut region UC having an undercut structure may be formed at a portion at which the $2\text{-}1^{th}$ electrode 161 is adjacent to the second $2\text{-}2^{th}$ electrode 162.

A method of forming the undercut region UC will be briefly described below with reference to FIGS. 9A to 9C.

First, a material included in the $1\text{-}1^{th}$ electrode 151 may be deposited on a whole upper end of the planarization layer 113, a material included in the $1\text{-}2^{th}$ electrode 152 may be deposited on the upper end subsequently, and the $1\text{-}2^{th}$ electrode 152 may be patterned subsequently.

Figure 9A:
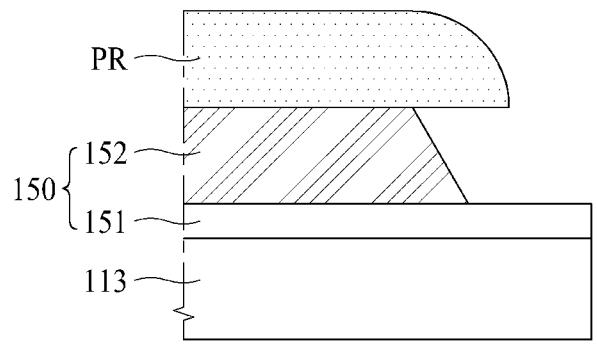
FIGS. 9A-9C are exemplary diagrams illustrating a method of forming an undercut region in a light emitting display panel according to the present disclosure.
Figure 9B:
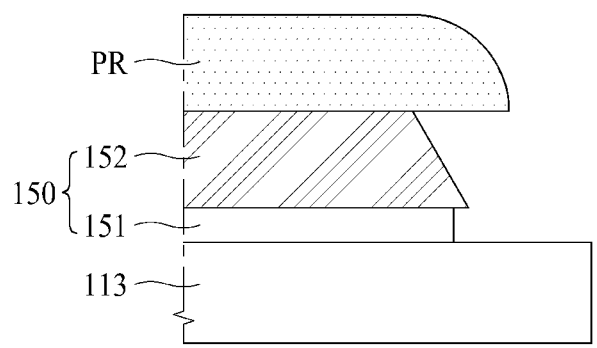

Subsequently, as illustrated in FIG. 9A, a photoresist PR may be coated on an upper end of the $1\text{-}2^{th}$ electrode 152, and based on the photoresist PR, as illustrated in FIG. 9B, the $1\text{-}1^{th}$ electrode 151 may be formed. In this case, an undercut structure may be formed at an end of each of the $1\text{-}1^{th}$ electrode 151 and the $1\text{-}2^{th}$ electrode 152.

Figure 9C:
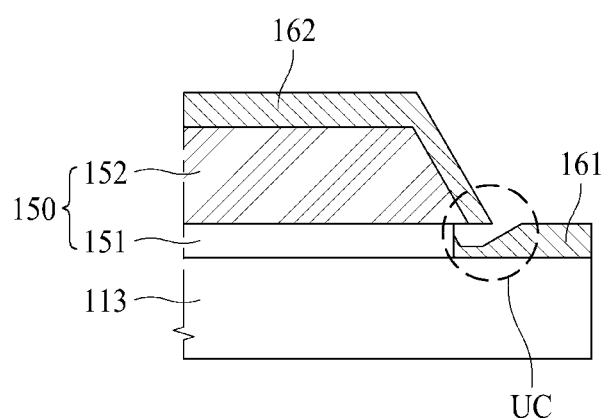

Finally, as illustrated in FIG. 9C, a second electrode 160 may be deposited on an upper end of the $1\text{-}2^{th}$ electrode 152 and the planarization layer 113.

In this case, the $2\text{-}1^{th}$ electrode 161, formed on the planarization layer 113, of the second electrode 160 may be electrically connected to a side surface of the $1\text{-}1^{th}$ electrode 151. Accordingly, the undercut region UC illustrated in FIG. 8 and FIG. 9C may be formed.

Figure 10:
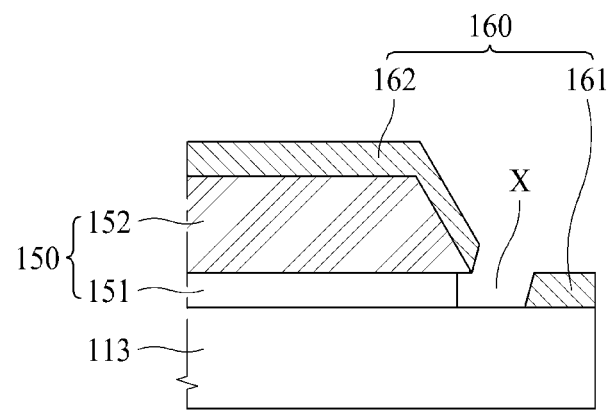
FIG. 10 is an exemplary diagram illustrating a structure where a $2\text{-}1^{th}$ electrode and a $2\text{-}2^{th}$ electrode are electrically disconnected from each other by a repair process or an aging process, in a light emitting display panel according to one embodiment of the present disclosure.

FIG. 10 is an exemplary diagram illustrating a structure where a $2\text{-}1^{th}$ electrode and a $2\text{-}2^{th}$ electrode are electrically disconnected from each other by a repair process or an aging process, in a light emitting display panel according to the present disclosure.

As described above, a thickness of the $2\text{-}1^{th}$ electrode 161 may be relatively less than that of the first electrode 150, and thus, the $2\text{-}1^{th}$ electrode 161 disposed in a trench TC may be easily removed.

Particularly, the $2\text{-}1^{th}$ electrode 161 may be formed in the undercut region UC in the trench TC. Also, a thickness of the $2\text{-}1^{th}$ electrode 161 formed in the undercut region UC may be thinner than that of the $2\text{-}1^{th}$ electrode 161 described above with reference to FIG. 5.

Therefore, in a case where a repair process or an aging process according to the present disclosure is performed, the $2\text{-}1^{th}$ electrode 161 may be more easily removed. Also, the through hole X may be more easily formed.

Figure 11:
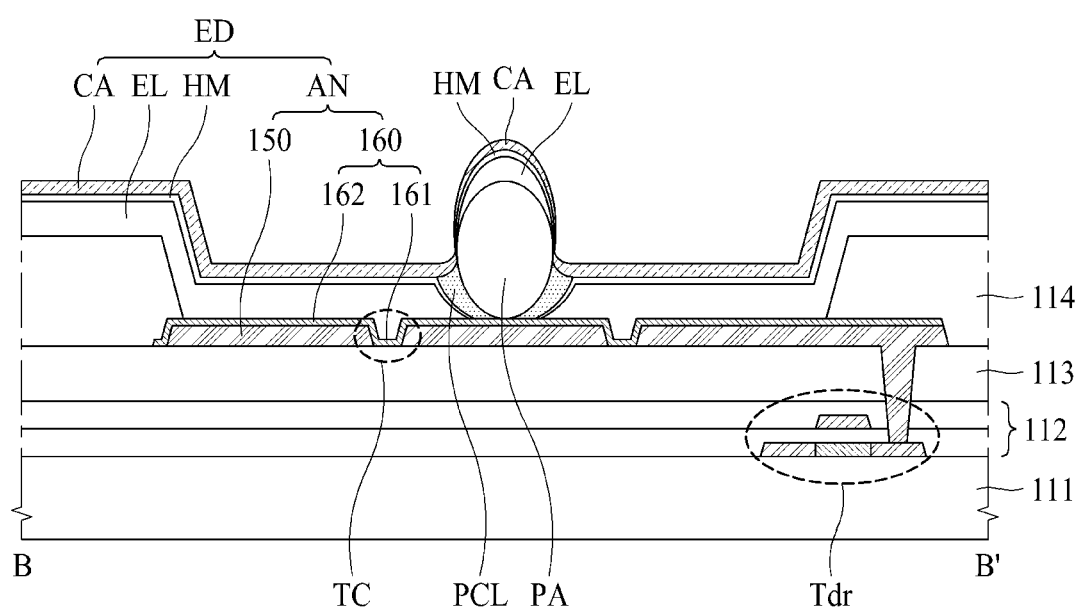
FIG. 11 is another exemplary diagram illustrating a cross-sectional surface of a light emitting display panel according to one embodiment of the present disclosure.
Figure 12:
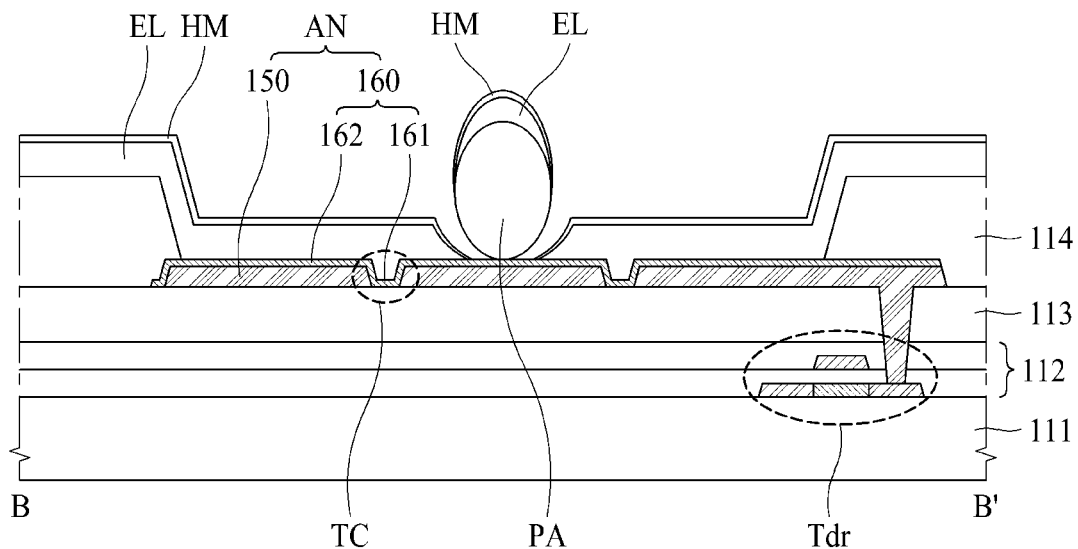
FIGS. 12 to 14 are exemplary diagrams illustrating a process of manufacturing the light emitting display panel illustrated in FIG. 11 according to one embodiment of the present disclosure.
Figure 13:
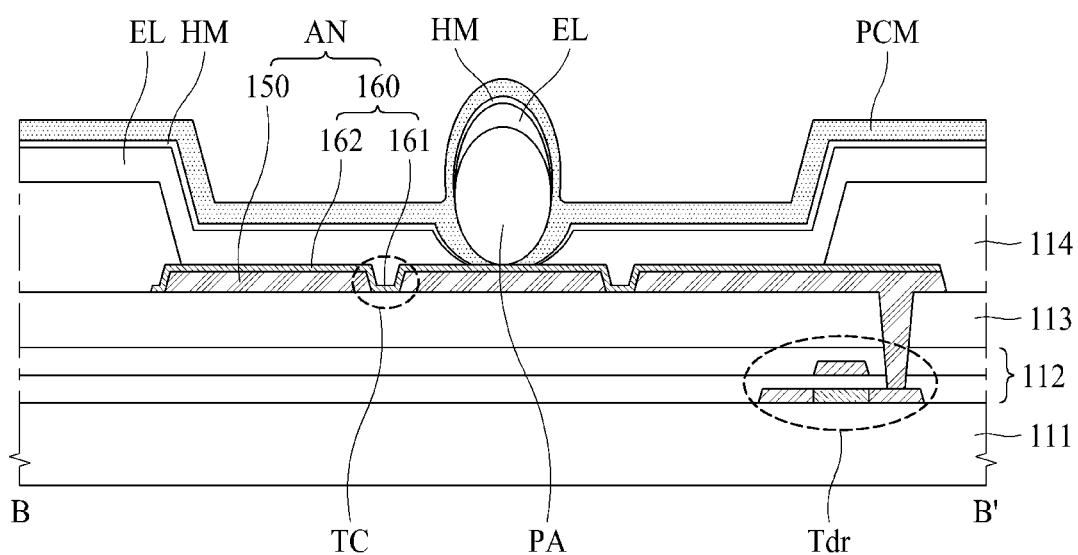
Figure 14:
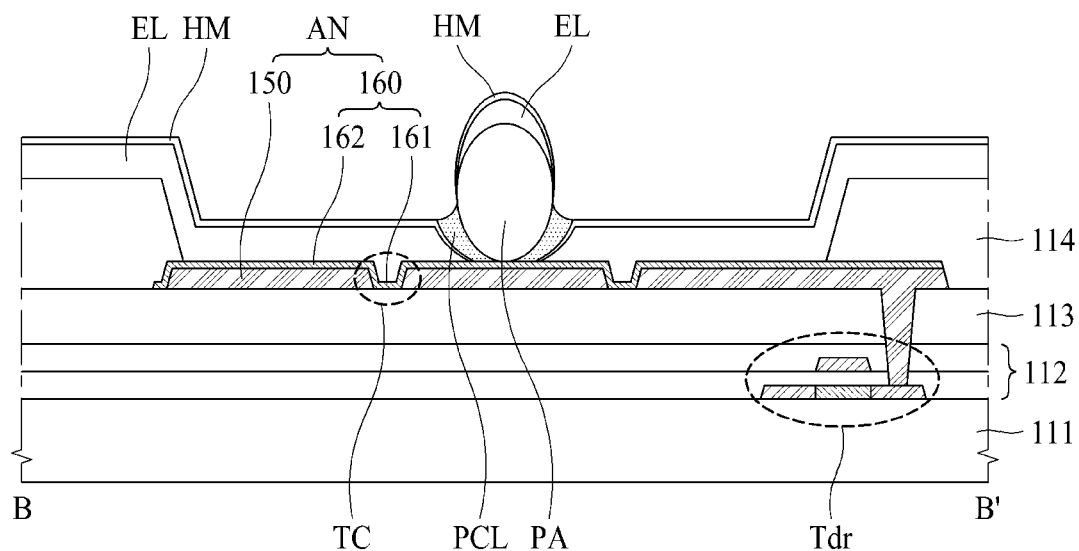

FIG. 11 is another exemplary diagram illustrating a cross-sectional surface of a light emitting display panel according to the present disclosure, and FIGS. 12 to 14 are exemplary diagrams illustrating a process of manufacturing the light emitting display panel illustrated in FIG. 11. Hereinafter, descriptions which are the same as or similar to descriptions given above with reference to FIGS. 1 to 10 are omitted or will be briefly given.

As described above, a pixel driving electrode AN may include a plurality of first electrodes 150 apart from one another and a second electrode 160 which covers the first electrodes 150.

In this case, as illustrated in FIG. 6, when a particle PA is disposed on the pixel driving electrode AN, a repair process or an aging process described above with reference to FIGS. 7A to 7C may be performed.

However, in the present disclosure, when the particle PA is disposed at an upper end of the pixel driving electrode AN, a repair process or an aging process described below may be performed, and finally, a light emitting display panel 100 according to the present disclosure illustrated in FIG. 11 may be manufactured.

In the light emitting display panel 100 according to the present disclosure, the particle PA may be provided at an upper end of the second electrode 160, a material included in a light emitting layer EL may be provided at an upper end of the particle PA, a particle cover layer PCL may be provided near a lower end Y of the particle PA, the particle cover layer PCL may be surrounded by the light emitting layer EL, and a common electrode CA may be provided at an upper end of each of light emitting layer EL, the particle cover layer PCL, and the particle PA. In this case, a material having hydrophobicity like fluorine may remain on an uppermost end of the light emitting layer EL, or a material having hydrophobicity may be removed together with a below-described particle cover material PCM in a process of removing the particle cover material PCM.

A process of manufacturing the light emitting display panel 100 according to the present disclosure will be described below.

First, as illustrated in FIG. 12, in a state where the particle PA is placed at an upper end of the pixel driving electrode AN (particularly, the second electrode 160), the light emitting layer EL may be formed on the upper end of each of the second electrode 160 and the particle PA.

Subsequently, as illustrated in FIG. 12, a material having hydrophobicity (hereinafter simply referred to as a hydrophobic material HM) (for example, fluorine) may be coated on an uppermost end of the light emitting layer EL. Hydrophobicity may denote a feature which is not good in bonding force to water.

Subsequently, as illustrated in FIG. 13, the particle cover material PCM may be coated on an upper end of the hydrophobic material HM by using a soluble process. The particle cover material PCM may be one of materials which are not bonded to the hydrophobic material HM and are well bonded to a metal material such as the pixel driving electrode AN.

Subsequently, as illustrated in FIG. 14, when the particle cover material PCM is removed at an appropriate level through a spin coating process, the particle cover material PCM may be removed from an upper portion of the light emitting layer EL having hydrophobicity, and the particle cover material PCM may remain on only the lower end Y of the particle PA at which the second electrode 160 is exposed. The particle cover material PCM remaining on the lower end Y of the particle PA may be referred to as a particle cover layer PCL. In this case, when the particle cover material PCM is removed, the hydrophobic material HM formed at an upper end of the light emitting layer EL may be removed together with the particle cover material PCM, or may remain.

Finally, the particle cover layer PCL may be cured at a level for reducing damage from occurring in the light emitting layer EL, and then, when the common electrode CA is deposited thereon, the light emitting display panel illustrated in FIG. 11 may be formed.

In this case, the common electrode CA may be deposited in a state where the second electrode 160 exposed at the lower end Y of the particle PA is covered by the particle cover layer PCL, and thus, the common electrode CA and the second electrode 160 may not electrically be connected to each other at the lower end Y of the particle PA.

Therefore, a defect where the common electrode CA is short-circuited with the pixel driving electrode AN may not occur based on the particle PA.

Figure 15:
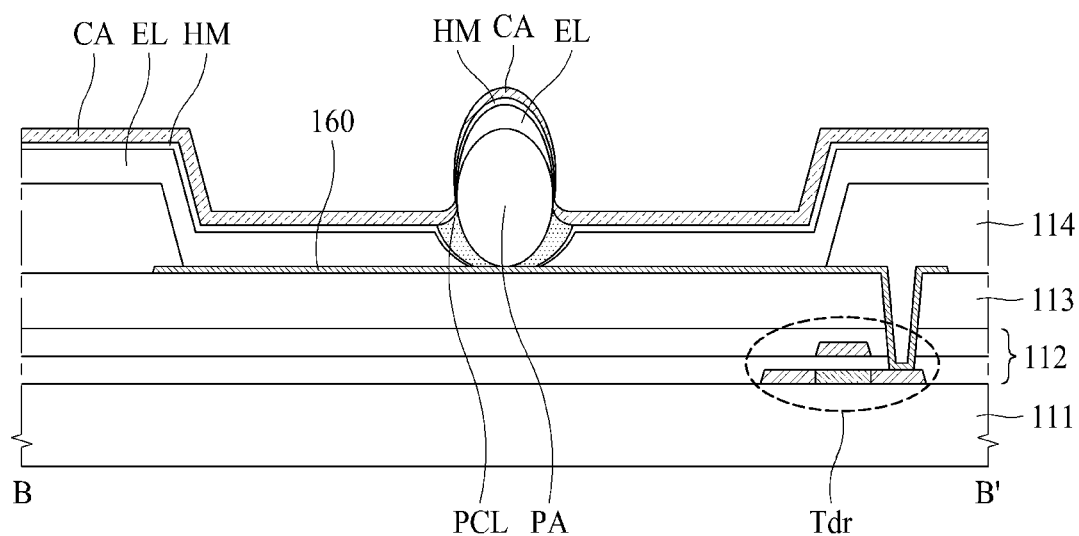
FIG. 15 is another exemplary diagram illustrating a cross-sectional surface of a light emitting display panel according to one embodiment of the present disclosure.

FIG. 15 is another exemplary diagram illustrating a cross-sectional surface of a light emitting display panel according to the present disclosure. Hereinafter, descriptions which are the same as or similar to descriptions given above with reference to FIGS. 11 to 14 are omitted or will be briefly given.

As described above, when the common electrode CA is deposited in a state where the second electrode 160 exposed at the lower end Y of the particle PA is covered by the particle cover layer PCL, the common electrode CA and the second electrode 160 may not electrically be connected to each other at the lower end Y of the particle PA. Therefore, a defect where the common electrode CA is short-circuited with the pixel driving electrode AN may not occur based on the particle PA.

In this case, as illustrated in FIGS. 11 to 14, the pixel driving electrode AN may include a plurality of first electrodes 150 and a second electrode 160 which covers the first electrodes 150.

However, as illustrated in FIG. 15, the pixel driving electrode AN may be configured in a plate shape. In this case, the pixel driving electrode AN may be formed of at least one layer by using various materials described above. In FIG. 15, the pixel driving electrode AN including only the second electrode 160 is illustrated.

The light emitting display panel according to the present disclosure may include a substrate 111, a pixel driving circuit PDC disposed on the substrate 111, a planarization layer 113 disposed at an upper end of the pixel driving circuit PDC, a pixel driving electrode AN which is disposed at an upper end of the planarization layer 113 and is electrically connected to the pixel driving circuit PDC, a light emitting layer EL disposed at an upper end of the pixel driving electrode AN, and a common electrode CA disposed at an upper end of the light emitting layer EL. In this case, a particle PA may be provided at the upper end of the pixel driving electrode AN, a material included in the light emitting layer EL may be provided at an upper end of the particle PA, a particle cover layer PCL may be provided near a lower end Y of the particle PA, the particle cover layer PCL may be surrounded by the light emitting layer EL, and a common electrode CA may be provided on an upper end of each of light emitting layer EL, the particle cover layer PCL, and the particle PA.

In a case where the particle PA is provided on the pixel driving electrode AN formed in a plate shape, processes described above with reference to FIG. 12 may be performed.

Therefore, the common electrode CA and the second electrode 160 may not electrically be connected to each other at the lower end Y of the particle PA. Therefore, a defect where the common electrode CA is short-circuited with the pixel driving electrode AN may not occur based on the particle PA.

Hereinafter, features of the present disclosure described above will be described.

First, in the present disclosure, as described above with reference to FIGS. 1 to 7C, a trench TC structure may be formed in the pixel driving electrode AN.

When the pixel driving electrode AN is formed on the planarization layer 113, each of the first electrodes 150 may be used as a reflector, and as the first electrodes 150 are separated from one another by a minimum line width, the trench TC structure may be formed.

The second electrode 160 including transparent metal such as ITO may be formed on the first electrodes 150 and the planarization layer 113 to have a thickness of tens nm.

The first electrodes 150 may be separated from one another, and the first electrodes 150 may be electrically connected to one another by the second electrode 160.

According to the present disclosure, in a light emitting display panel based on a top emission type, defects caused by an initial dark spot and a progressive dark spot may be reduced.

To provide an additional description, in the present disclosure, the first electrodes 150 which configure the pixel driving electrode AN and are used as reflectors may be divided into a plurality of electrodes to form a trench structure, and Joule's heat may occur in a portion where short circuit between the pixel driving electrode AN and the common electrode CA occurs due to a particle. ITO (i.e., the 2-1$^{th}$ electrode 161) of a local region may be disconnected due to Joule's heat, and thus, only a region with the particle PA disposed therein may be blackened in one pixel and the other regions may normally emit light.

In the related art, when a defect caused by a particle occurs, a method of short-circuiting a common electrode (i.e., a cathode) is applied. However, in the present disclosure, all of the pixel driving electrode AN, the light emitting layer EL, and the common electrode CA may be cut, thereby reducing the occurrence of a progressive dark spot.

Therefore, according to the present disclosure, a yield rate of a light emitting display panel based on the top emission type may be enhanced, and defects caused by an initial dark spot and a progressive dark spot may be reduced.

Subsequently, in the present disclosure, as described above with reference to FIGS. 8 to 10, an undercut structure may be formed in the pixel driving electrode AN.

The first electrode 150 may include a $1\text{-}1^{th}$ electrode 151 and a $1\text{-}2^{th}$ electrode 152, and a reverse tapered structure or an undercut structure where the $1\text{-}1^{th}$ electrode 151 is formed inward from the $1\text{-}2^{th}$ electrode 152 may be formed at an end of each of the first $1\text{-}1^{th}$ electrode 151 and the $1\text{-}2^{th}$ electrode 152.

To provide an additional description, the first electrode 150 may include the $1\text{-}1^{th}$ electrode 151 including Mo and the $1\text{-}2^{th}$ electrode 152 including ITO, and an undercut structure may be formed based on the first $1\text{-}1^{th}$ electrode 151 and the $1\text{-}2^{th}$ electrode 152.

In this case, in an undercut region UC with the undercut structure provided therein, a $2\text{-}1^{th}$ electrode 161 and a $2\text{-}2^{th}$ electrode 162 configuring the second electrode 160 may be apart from each other, and particularly, a thickness of the $2\text{-}1^{th}$ electrode 161 provided in the undercut region UC may be formed to be thinner than that of the $2\text{-}1^{th}$ electrode 161 provided in a region other than the undercut region UC.

Therefore, based on the undercut structure, the $2\text{-}1^{th}$ electrode 161 may be more easily cut. The $2\text{-}1^{th}$ electrode 161 may be cut by using heat caused by Joule's heat as described above.

Finally, in the present disclosure, as described above with reference to FIGS. 11 to 15, a particle cover layer PCL may be formed in a manufacturing process.

The pixel driving electrode AN disposed at a lower end Y of the particle PA may be covered by the particle cover layer PCL, and thus, a defect where the common electrode CA is short-circuited with the pixel driving electrode AN at the lower end Y of the particle PA may not occur.

To this end, a material having hydrophobicity (a hydrophobic material HM) may be formed at an uppermost end of the light emitting layer EL. The hydrophobic material HM may use fluorine. That is, a fluorine-based material may be a stable material, and thus, may have a characteristic which is not bonded to another material.

A particle cover material PCM may be formed at an upper end of the hydrophobic material HM through a soluble process, and based on a spin coating process, a portion at which the pixel driving electrode AN disposed at the lower end Y of the particle PA is exposed may be filled by the particle cover layer PCL, and thus, short circuit between the pixel driving electrode AN and the common electrode CA may be reduced.

In the present disclosure using such a method, unlike an aging process using Joule's heat, short circuit between the pixel driving electrode AN and the common electrode CA may be fundamentally reduced. Accordingly, according to the present disclosure, a yield rate of a light emitting display panel based on the top emission type may be enhanced.

To provide an additional description, an organic layer component generated after an adhesive and functional (AF) part is deposited may be an AF over-coating layer, and an over-coating layer may have fluidity because bonding is unstable. Accordingly, the particle cover layer PCL may be deposited on only the lower end Y of the particle PA where the hydrophobic material HM is insufficient or is not provided, and the pixel driving electrode AN exposed at the lower end Y may be covered by the particle cover layer PCL.

Figure 16:
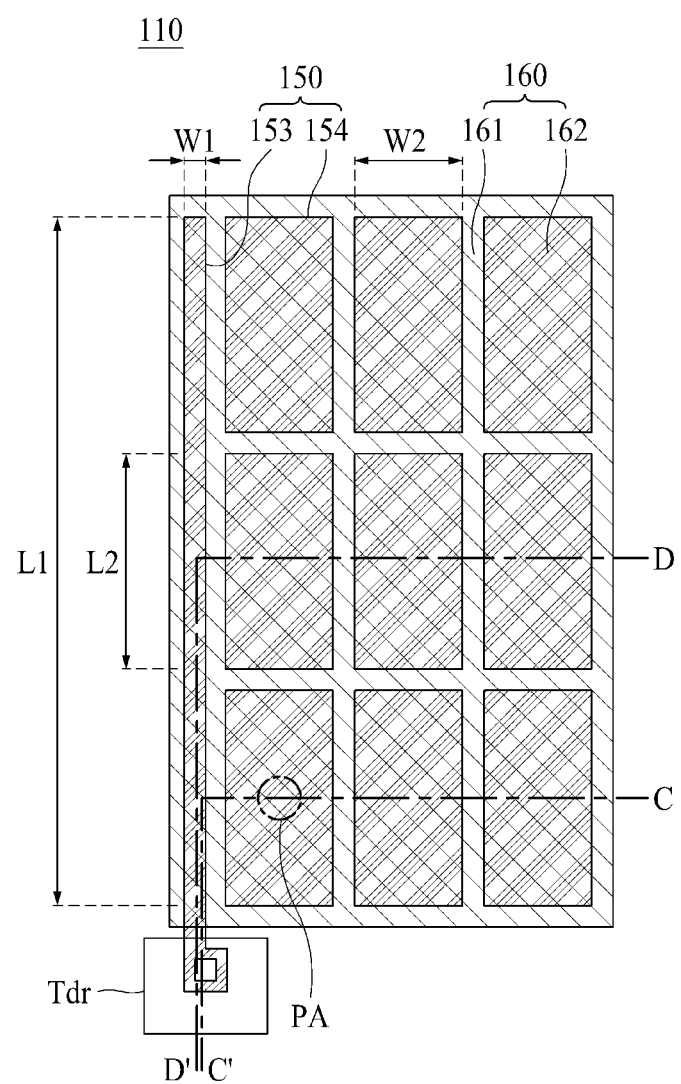
FIGS. 16 and 17 are other exemplary diagrams illustrating a plane of a pixel driving electrode of a pixel included in a light emitting display panel according to one embodiment of the present disclosure.
Figure 17:
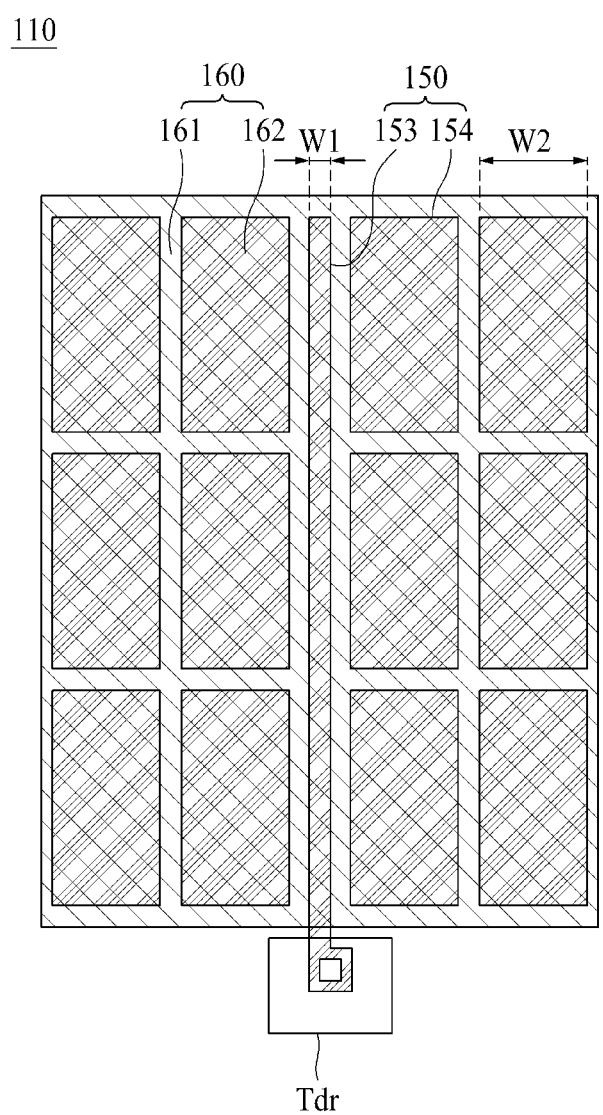
Figure 18A:
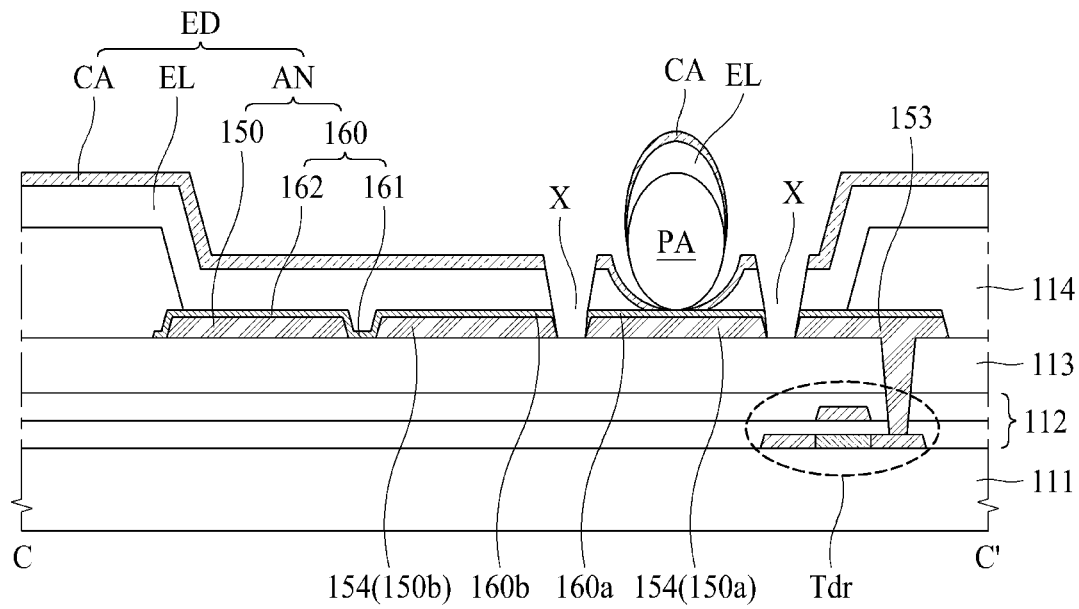
FIGS. 18A to 18C are exemplary diagrams illustrating a cross-sectional surface taken along line C-C' illustrated in FIG. 16 according to one embodiment of the present disclosure.
Figure 18B:
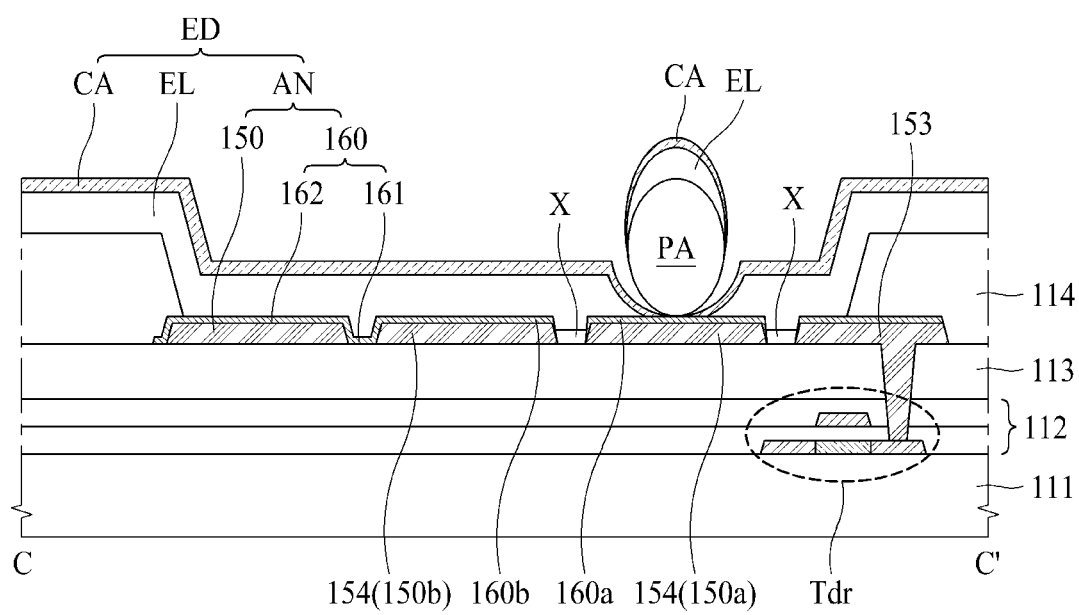
Figure 18C:
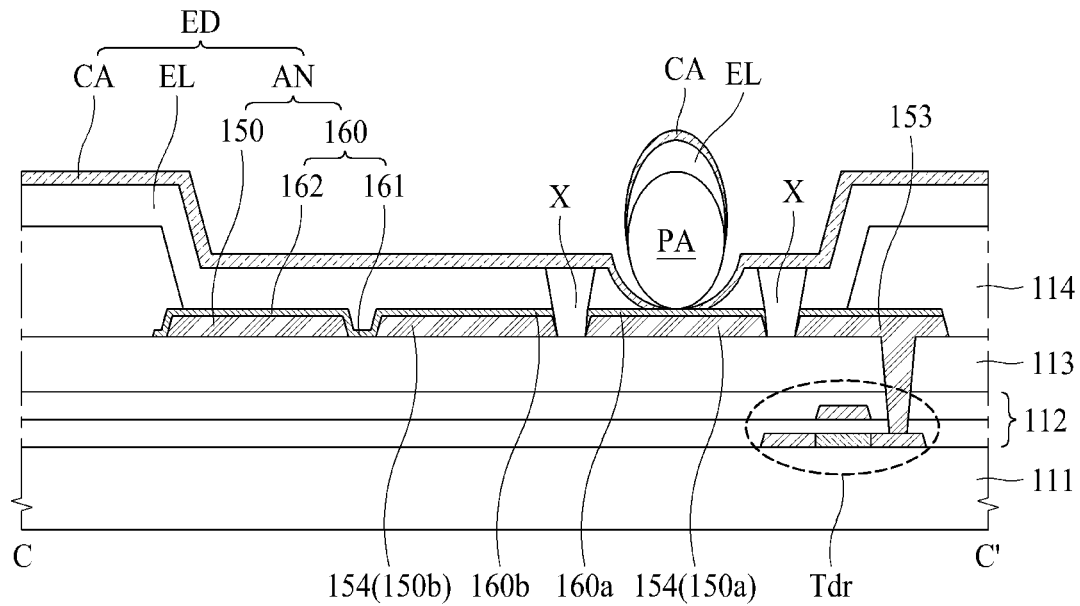
Figure 19:
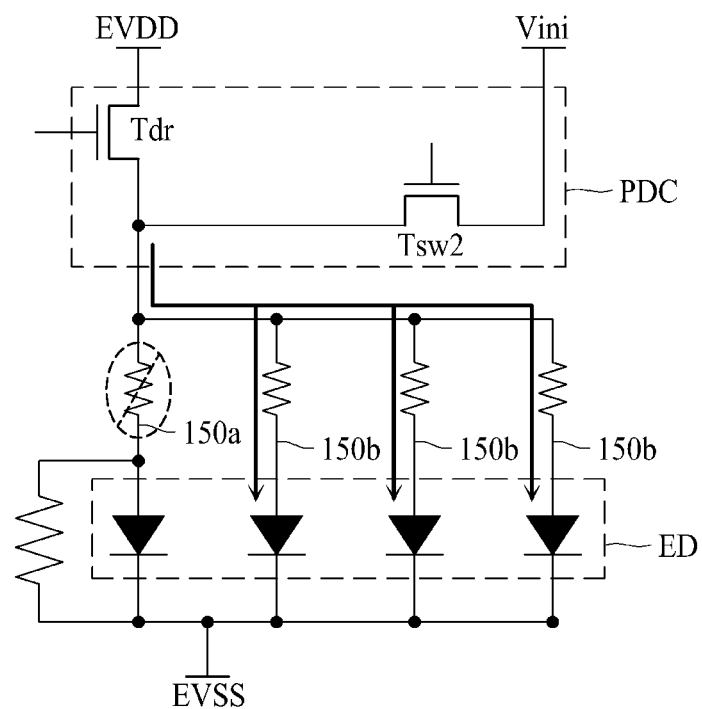
FIG. 19 is an exemplary diagram illustrating a connection relationship between a pixel driving circuit and a light emitting device when particles are in a pixel of a light emitting display panel according to one embodiment of the present disclosure.

FIGS. 16 and 17 are other exemplary diagrams illustrating a plane of a pixel driving electrode of a pixel included in a light emitting display panel according to the present disclosure. FIGS. 18A to 18C are exemplary diagrams illustrating a cross-sectional surface taken along line C-C' illustrated in FIG. 16. FIG. 19 is an exemplary diagram illustrating a connection relationship between a pixel driving circuit and a light emitting device when particles are in a pixel of a light emitting display panel according to the present disclosure. Particularly, FIGS. 18A to 18C illustrate a pixel driving electrode AN included in one pixel. Hereinafter, descriptions which are the same as or similar to descriptions given above with reference to FIGS. 1 to 15 are omitted or will be briefly given. In the following description, elements which perform the same functions as those of the elements described above with reference to FIGS. 1 to 15 are referred to by like reference numerals applied to FIGS. 1 to 15.

As described above, a light emitting display panel 100 according to the present disclosure may include a substrate 111, a pixel driving circuit PDC which includes a driving transistor Tdr disposed on the substrate 111, a planarization layer 113 which is disposed on the pixel driving circuit PDC, a pixel driving electrode AN which is disposed on the planarization layer 113 and is electrically connected to the driving transistor Tdr of the pixel driving circuit PDC, a light emitting layer EL which is disposed on the pixel driving electrode AN, and a common electrode CA which is disposed on the light emitting layer EL. The pixel driving electrode AN may include a plurality of first electrodes 150 disposed apart from one another and a second electrode 160 formed to cover the plurality of first electrodes 150. The second electrode 160 may electrically connect the plurality of first electrodes 150 apart from one another.

Referring to FIG. 16, the first electrode 150 may include a connection electrode 153 connected to the driving transistor Tdr and a plurality of division electrodes 154 apart from one another.

In the light emitting display panel illustrated in FIG. 4, a first electrode connected to the driving transistor Tdr among the first electrodes 150 may be connected to the connection electrode 153, and the other first electrodes may be the division electrodes 154.

In this case, as illustrated in FIG. 4, a shape of the connection electrode 153 may be the same as or similar to that of each of the division electrodes 154. Alternatively, as illustrated in FIG. 16, a shape of the connection electrode 153 may differ from that of each of the division electrodes 154.

For example, as illustrated in FIG. 16, the division electrodes 154 may be formed in a tetragonal shape, and the connection electrode 153 may be formed in a linear shape.

The connection electrode 153 may be formed to have a shape which differs from that of each of the division electrodes 154. For example, a width W1 of the connection electrode 153 may be set to be less than a width W2 of the division electrode 154. Also, a length L1 of the connection electrode 153 may be set to be longer than a length L2 of the division electrode 154.

The connection electrode 153 may be formed in a first direction (for example, a direction parallel to a data line) of the light emitting display panel 100. For example, referring to FIG. 16, the connection electrode 153 may extend in a lengthwise direction of a pixel 110, and the data line may extend in the lengthwise direction of the pixel 110. However, the present disclosure is not limited thereto. For example, the connection electrode 153 may extend in a direction vertical to the data line. Therefore, the connection electrode 153 may extend in a widthwise direction of a pixel 110.

The connection electrode 153 may be formed in a linear shape which extends in the first direction of the light emitting display panel 100. The first direction may be one of various directions which may be formed on a plane of the light emitting display panel 100. For example, the first direction may be a lengthwise direction, or may be a widthwise direction.

At least two division electrodes 154 may face the connection electrode 153 in the lengthwise direction of the connection electrode 153.

In the pixel 110 illustrated in FIG. 16, the plurality of division electrodes 154 may be provided in a direction in which the connection electrode 153 extends. The connection electrode 153 may be formed to extend in a lengthwise direction thereof. Also, the plurality of division electrodes 154 facing the connection electrode 153 may be provided on one side of the connection electrode 153 extending in the lengthwise direction.

Moreover, in a pixel 110 illustrated in FIG. 17, a plurality of division electrodes 154 may be provided in a lengthwise direction of a connection electrode 153. A plurality of division electrodes 154 facing the connection electrode 153 may be respectively provided at one side and the other side of the connection electrode 153 with the connection electrode 153 therebetween.

At least two division electrodes 154 may face the connection electrode 153 in the lengthwise direction of the connection electrode 153. Alternatively, at least two division electrodes 154 may be respectively provided at both sides of the connection electrode 153 with the connection electrode 153 therebetween to face the connection electrode 153.

Moreover, in the pixel 110 illustrated in FIG. 17, a same number of division electrodes 154 may be provided at one side and the other side with respect to the connection electrode 153, but the number of division electrodes 154 provided at one side of the connection electrode 153 may differ from the number of division electrodes 154 provided at the other side of the connection electrode 153.

A position of the connection electrode 153 may be variously changed in the pixel 110.

The division electrodes 154, as illustrated in FIG. 16, may be formed in a tetragonal plate shape. However, the present disclosure is not limited thereto. For example, the division electrodes 154 may be formed in a polygonal shape such as a triangular shape, a pentagonal shape, or a hexagonal shape, in addition to a tetragonal shape. Alternatively, the division electrode 154 may be formed in various shapes where sides thereof have different lengths.

Moreover, shapes of the division electrodes 154 may be the same, but may differ. Also, sizes of the division electrodes 154 may be the same, but may differ.

Referring to FIGS. 16 and 17, a width W1 of the connection electrode 153 may be set to be less than a width W2 of each of the division electrodes 154. Accordingly, a probability that a particle PA is provided in the connection electrode 153 may decrease.

The width W1 of the connection electrode 153 may be set to be less than the width W2 of each of the division electrodes 154, and thus, the possibility that the particle PA is provided in at least one of the division electrodes 154 instead of the connection electrode 153 may be high.

For example, as illustrated in FIGS. 18A to 18C, a division electrode 154 (hereinafter referred to as a first particle electrode 150a) where the particle PA occurs may be electrically disconnected from division electrodes 154 (hereinafter referred to as a first normal electrode 150b) where the particle PA does not occur, based on an aging process. Accordingly, the pixel 110 may normally emit light by using the first normal electrodes 150b and the second normal electrode 160b.

That is, a through hole X illustrated in FIG. 18A may be formed by an etching process (for example, a wet etching process, a dry etching process, or a dry and wet etching process). However, the present disclosure is not limited thereto. For example, the etching process may include a cutting process using a laser, or may include a heating process.

For example, in a case where the through hole X is formed through a heating process using Joule's heat, as illustrated in FIG. 18A, all of the 2-1$^{th}$ electrode 161, the light emitting layer EL, and the common electrode CA may be disconnected. Also, as illustrated in FIG. 18B, only the 2-1$^{th}$ electrode 161 may be disconnected. Alternatively, as illustrated in FIG. 18C, only the 2-1$^{th}$ electrode 161 and the light emitting layer EL may be disconnected.

As illustrated in FIGS. 18A to 18C and 19, light may not be emitted from a light emitting device ED corresponding to the first particle electrode 150a which is electrically disconnected from the first normal electrode 150b and the second normal electrode 160b, and light may be emitted from a light emitting device ED corresponding to the first normal electrode 150b.

A width of a connection electrode 153 directly connected to a driving transistor Tdr configuring a pixel driving circuit PDC may be set to be less than that of each of the division electrodes 154. Because the width of the connection electrode 153 may be set to be less than that of each of the division electrodes 154, the possibility that the particle PA is provided on the connection electrode 153 may decrease. Also, a division electrode 154 with the particle PA provided thereon may be electrically disconnected from the other division electrodes 154 through an aging process. A division electrode 154 divided through an aging process may be blackened, and based on the other division electrodes 154 which are not divided, the pixel 110 may normally emit light.

Figure 20:
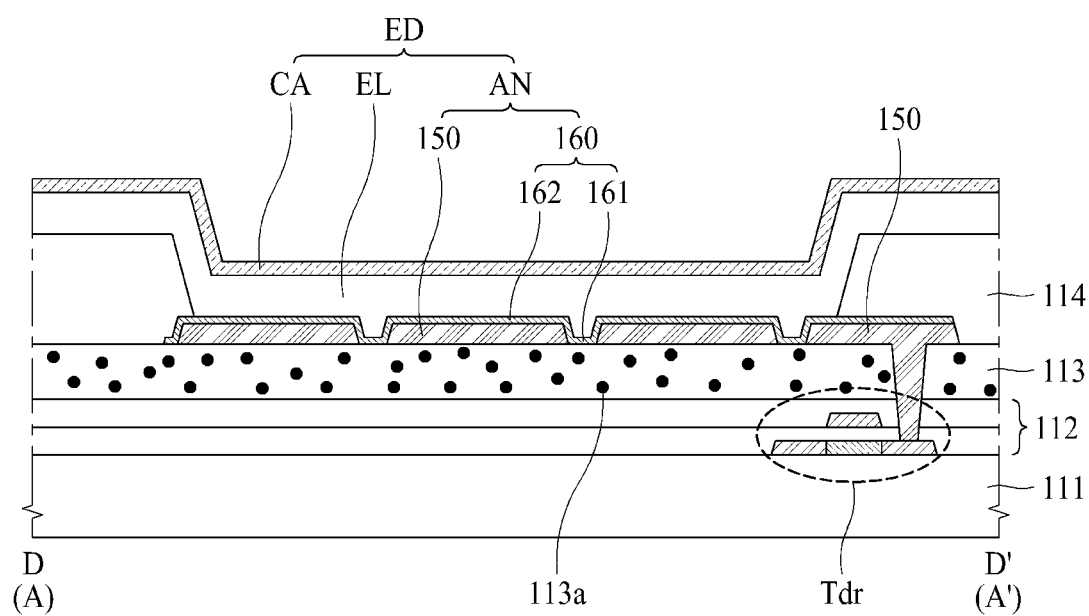
FIG. 20 is an exemplary diagram illustrating a cross-sectional surface taken along line D-D' illustrated in FIG. 16 according to one embodiment of the present disclosure.
Figure 21:
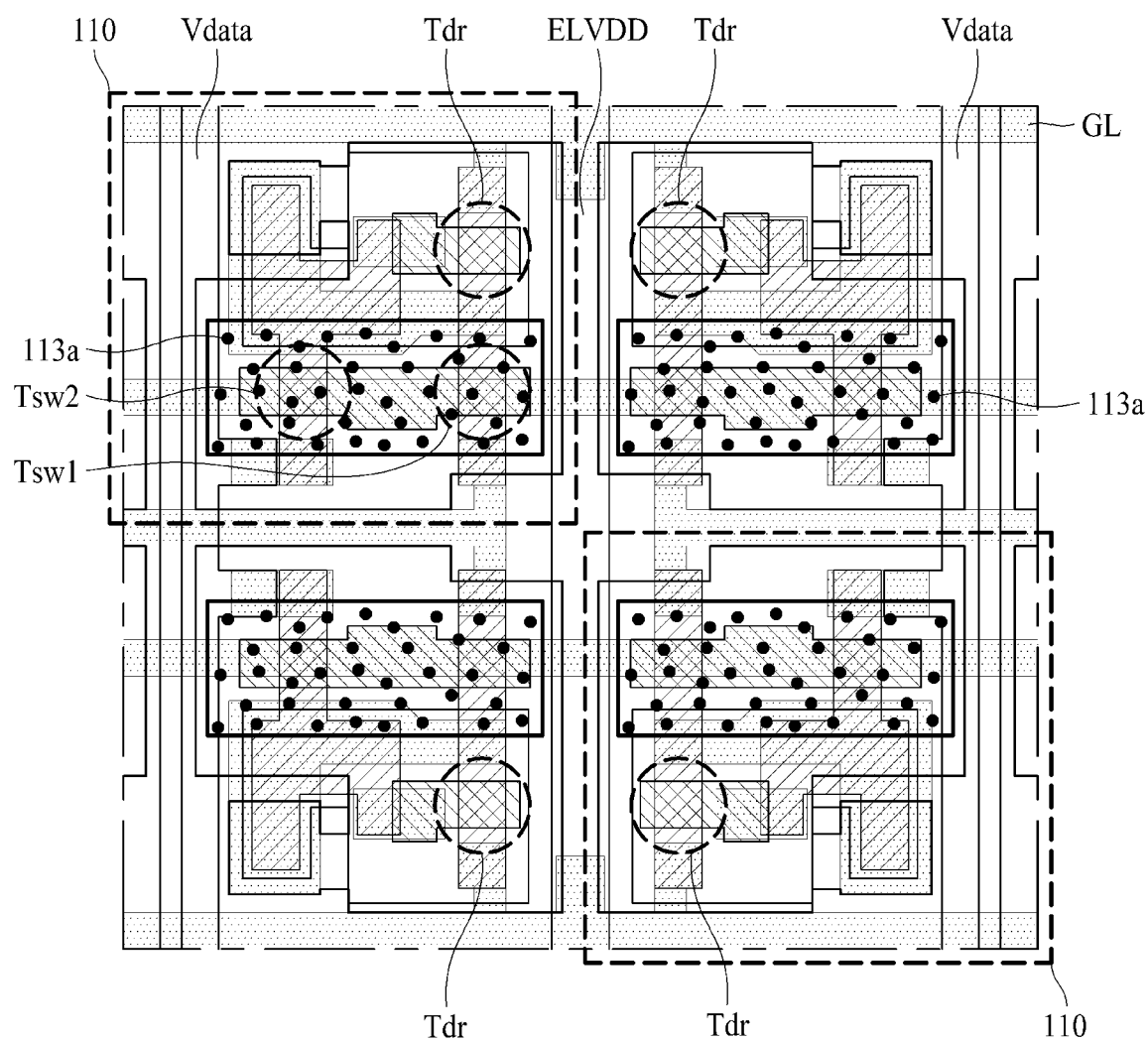
FIG. 21 is a plan view of each of four pixels applied to a light emitting display panel according to one embodiment of the present disclosure.

FIG. 20 is an exemplary diagram illustrating a cross-sectional surface taken along line D-D' illustrated in FIG. 16, and FIG. 21 is a plan view of each of four pixels applied to a light emitting display panel according to the present disclosure. Particularly, a light blocking particle 113a described below with reference to FIG. 20 is illustrated in FIG. 21. A cross-sectional surface illustrated in FIG. 20 may be a cross-sectional surface taken along line A-A' illustrated in FIG. 4. When the cross-sectional surface illustrated in FIG. 20 is the cross-sectional surface taken along line A-A' illustrated in FIG. 4, three first electrodes 150 are illustrated along line A-A' in FIG. 4, but in the following description, it may be assumed that four first electrodes 150 are provided. Hereinafter, descriptions which are the same as or similar to descriptions given above with reference to FIGS. 1 to 19 are omitted or will be briefly given.

A light emitting display panel 100 according to the present disclosure may include a substrate 111, a pixel driving circuit PDC which includes a driving transistor Tdr disposed on the substrate 111, a planarization layer 113 which is disposed on the pixel driving circuit PDC, a pixel driving electrode AN which is disposed on the planarization layer 113 and is electrically connected to the driving transistor Tdr of the pixel driving circuit PDC, a light emitting layer EL which is disposed on the pixel driving electrode AN, and a common electrode CA which is disposed on the light emitting layer EL. The pixel driving electrode AN may include a plurality of first electrodes 150 disposed apart from one another and a second electrode 160 formed to cover the plurality of first electrodes 150. Also, at least one of the second electrode 160 and the first electrodes 150 may be connected to the pixel driving circuit PDC.

The first electrodes 150 configuring the pixel driving electrode AN may be connected to one another, and thus, when the light emitting display panel 100 according to the present disclosure is the top emission type, light emitted from the light emitting layer EL may be leaked to the pixel driving circuit PDC through a gap between the first electrodes 150.

Light having a short wavelength among leaked light may cause the degradation (TFT degradation) in quality of a transistor included in the pixel driving circuit PDC. For example, light having a wavelength of less than 500 nm among leaked light may cause the degradation (TFT degradation) in quality of the transistor included in the pixel driving circuit PDC. Therefore, light which is emitted from the light emitting layer EL and is leaked to the pixel driving circuit PDC through a gap between the first electrodes 150 may need to be blocked.

To this end, in the present disclosure, as illustrated in FIG. 20, a nano particle or a quantum dot having a light blocking characteristic or a light scattering characteristic (hereinafter referred to as a light blocking particle 113a) may be provided in the planarization layer 113. The planarization layer 113 including a light blocking particle 113a may perform a function of a light blocking layer.

Light leaked from the light emitting layer EL to the pixel driving circuit PDC may be blocked by the planarization layer 113 for performing a function of a light blocking layer. Because the light leaked from the light emitting layer EL to the pixel driving circuit PDC is blocked by the planarization layer 113 including the light blocking particle 113a, the degradation (TFT degradation) in quality of a transistor may be reduced.

The light blocking particle 113a included in the planarization layer 113 may be a nano particle NP or a quantum dot QD including a metal material such as gold or silver.

Generally, the planarization layer may be formed by coating at least one (hereinafter referred to as a planarization layer material) of an organic material and an inorganic material. By using such a dot, the light blocking particles 113a having a light scattering characteristic or a light dispersion characteristic may be provided in the planarization layer material. Alternatively, the planarization layer material including the light blocking particles 113a may be coated on an upper end of the pixel driving circuit PDC, and thus, the planarization layer 113 may be formed.

In a case where light having a specific wavelength reaches a surface of the light blocking particle 113a, on the basis of a plasmon phenomenon, when the wavelength of the light matches a vibration period of plasmon of the surface of the light blocking particle 113a, the light may be absorbed or scattered by the surface of the light blocking particle 113a.

A wavelength absorbed by the surface of the light blocking particle 113a may mainly correspond to an ultraviolet (UV) range, but the light blocking particle 113a may scatter or absorb a wavelength of a visible light range.

Therefore, light flowing into a region between the first electrodes 150 may be blocked by the planarization layer 113 including the light blocking particles 113a.

The light blocking particles 113a may be provided in a whole region corresponding to a display area AA of the substrate 111.

For example, the light blocking particles 113a for performing a light blocking function may be provided all over the planarization layer 113 which is disposed to correspond to the display area AA.

However, the present disclosure is not limited thereto. For example, the light blocking particles 113a may be provided in only a region, corresponding to the pixel driving circuit PDC, of the planarization layer 113 included in the substrate 111.

For example, the light blocking particles 113a may be provided in the planarization layer 113 to cover all of the pixel driving circuit PDC.

Alternatively, the light blocking particles 113a may be provided in the planarization layer 113 to cover at least one of two or more transistors included in the pixel driving circuit PDC.

Referring to FIG. 3, the pixel driving circuit PDC may include a driving transistor Tdr which is connected to the pixel driving electrode AN, a switching transistor Tsw1 which is connected to a gate electrode of the driving transistor Tdr, a sensing transistor Tsw2 which is connected between the driving transistor Tdr and the pixel driving electrode AN, and an emission transistor Tsw3 which controls flowing of a current to the driving transistor Tdr.

In this case, as illustrated in FIG. 20, the light blocking particles 113a provided in the planarization layer 113 for performing a light blocking function may be provided in at least one of a region between the switching transistor Tsw1 and the pixel driving electrode AN, a region between the sensing transistor Tsw2 and the pixel driving electrode AN, a region between the emission transistor Tsw3 and the pixel driving electrode AN, and a region between the driving transistor Tdr and the pixel driving electrode AN. Here, the pixel driving electrode AN may denote the first electrodes 150.

For example, as illustrated in FIG. 21, the light blocking particles 113a may be provided between the switching transistor Tsw1 and the pixel driving electrode AN and between the sensing transistor Tsw2 and the pixel driving electrode AN.

The reason that the light blocking particles 113a are not provided in the planarization layer 113 disposed between the driving transistor Tdr and the pixel driving electrode AN is because the mobility of the driving transistor Tdr is more enhanced by light leaked to a gap between the first electrodes 150. Also, the reason is because the emission efficiency of the light emitting device ED increases as the mobility of the driving transistor Tdr is enhanced.

However, because a characteristic of each of the switching transistor Tsw1 and the sensing transistor Tsw2 should not be changed, the light blocking particles 113a may be provided in the planarization layer 113 disposed in a region corresponding to the switching transistor Tsw1 and the sensing transistor Tsw2.

That is, due to light leaked to a gap between the first electrodes 150, the light blocking particles 113a may not be provided in a transistor having an enhanced characteristic, but due to the light leaked to the gap between the first electrodes 150, the light blocking particles 113a may be provided in a transistor where a characteristic thereof should not be changed.

Figure 22:
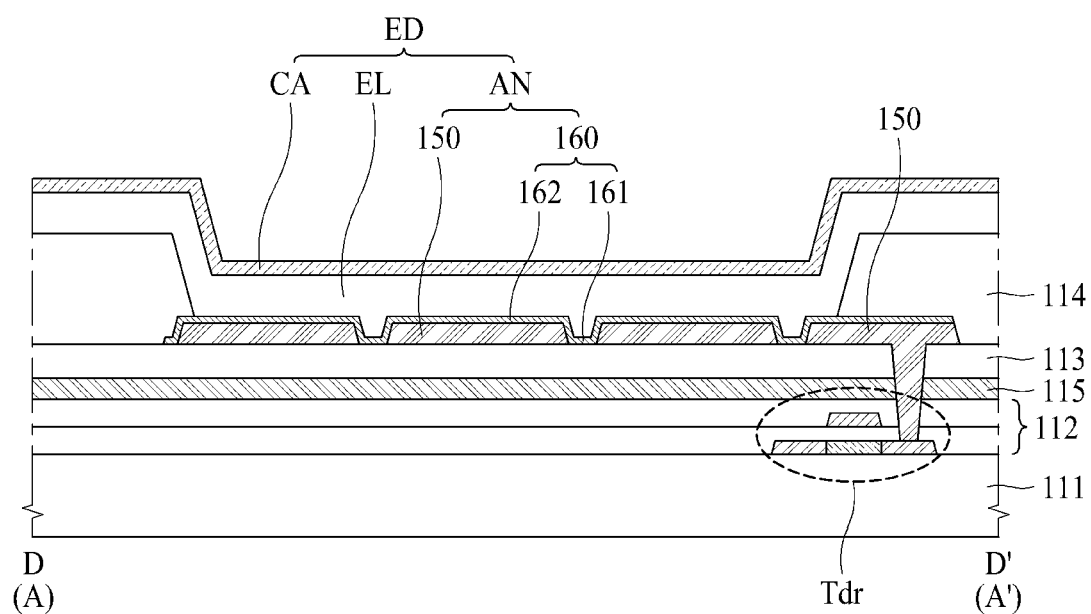
FIG. 22 is another exemplary diagram illustrating a cross-sectional surface taken along line D-D' illustrated in FIG. 16 according to one embodiment of the present disclosure.
Figure 23:
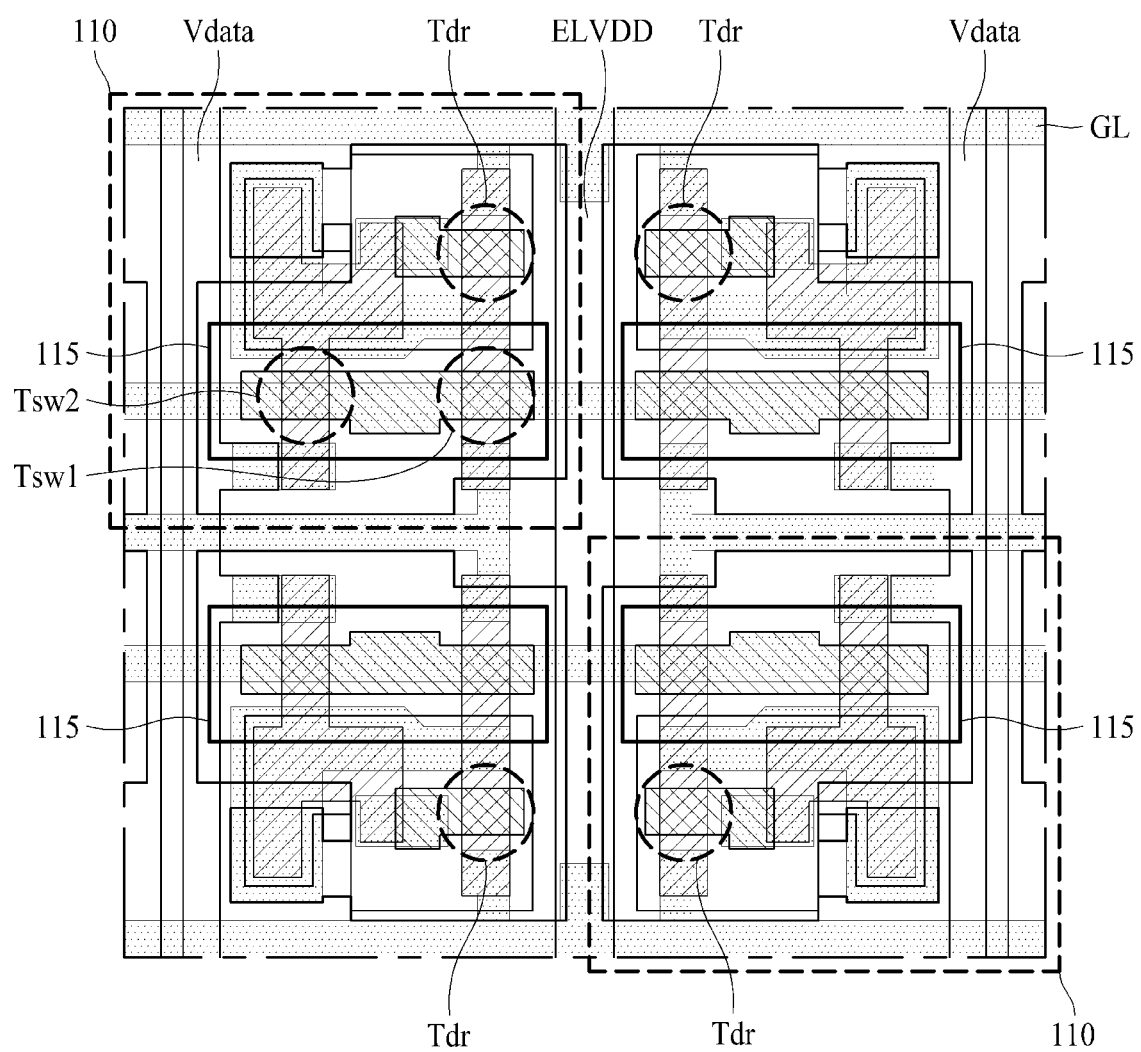
FIG. 23 is another plan view of each of four pixels applied to a light emitting display panel according to one embodiment of the present disclosure.

FIG. 22 is another exemplary diagram illustrating a cross-sectional surface taken along line D-D' illustrated in FIG. 16, and FIG. 23 is another plan view of each of four pixels applied to a light emitting display panel according to the present disclosure. Particularly, a light blocking layer 115 described below with reference to FIG. 22 is illustrated in FIG. 23. A cross-sectional surface illustrated in FIG. 22 may be a cross-sectional surface taken along line A-A' illustrated in FIG. 4. When the cross-sectional surface illustrated in FIG. 22 is the cross-sectional surface taken along line A-A' illustrated in FIG. 4, three first electrodes 150 are illustrated along line A-A' in FIG. 4, but in the following description, it may be assumed that four first electrodes 150 are provided. Hereinafter, descriptions which are the same as or similar to descriptions given above with reference to FIGS. 1 to 19 are omitted or will be briefly given.

A light emitting display panel 100 according to the present disclosure may include a substrate 111, a pixel driving circuit PDC which includes a driving transistor Tdr disposed on the substrate 111, a planarization layer 113 which is disposed on the pixel driving circuit PDC, a pixel driving electrode AN which is disposed on the planarization layer 113 and is electrically connected to the driving transistor Tdr of the pixel driving circuit PDC, a light emitting layer EL which is disposed on the pixel driving electrode AN, and a common electrode CA which is disposed on the light emitting layer EL. The pixel driving electrode AN may include a plurality of first electrodes 150 disposed apart from one another and a second electrode 160 formed to cover the plurality of first electrodes 150. Also, at least one of the second electrode 160 and the first electrodes 150 may be connected to the pixel driving circuit PDC.

The first electrodes 150 configuring the pixel driving electrode AN may be connected to one another, and thus, when the light emitting display panel 100 according to the present disclosure is the top emission type, light emitted from the light emitting layer EL may be leaked to the pixel driving circuit PDC through a gap between the first electrodes 150.

Light having a short wavelength among leaked light may cause the degradation (TFT degradation) in quality of a transistor included in the pixel driving circuit PDC. For example, light having a wavelength of less than 500 nm among leaked light may cause the degradation (TFT degradation) in quality of the transistor included in the pixel driving circuit PDC. Therefore, light which is emitted from the light emitting layer EL and is leaked to the pixel driving circuit PDC through a gap between the first electrodes 150 may need to be blocked.

The light emitting display panel 100 according to the present disclosure, as illustrated in FIG. 22, may further include a light blocking layer 115 provided between the pixel driving circuit PDC and the planarization layer 113, for blocking light flowing into a region between the first electrodes 150.

The light blocking layer 115 may include a silicon (Si) layer or a germanium (Ge) layer. Alternatively, the light blocking layer 115 may be a combination layer including a Si layer and a Ge layer.

The Si layer included in the light blocking layer 115 may be an amorphous Si (a-Si) layer, and the Ge layer included in the light blocking layer 115 may be an amorphous Ge (a-Ge) layer.

A transmittance of light having a short wavelength may be low in the a-Si layer and the a-Ge layer, and thus, light may be blocked by the a-Si layer and the a-Ge layer.

The light blocking layer 115 may be a multilayer including an a-Si layer and an a-Ge layer. In this case, light may be blocked due to a refractive index between the layers.

The light blocking layer 115 may be a single layer having an amorphous characteristic where a transmittance is low in a short wavelength range. Alternatively, the light blocking layer 115 may be formed of a combination layer including single layers having an amorphous characteristic.

As described above with reference to FIG. 22, light flowing into a region between the first electrodes 150 may be blocked by a light blocking layer 115 provided between the pixel driving circuit PDC and the planarization layer 113.

The light blocking layer 115 provided between the pixel driving circuit PDC and the planarization layer 113 may be provided in a whole region corresponding to a display area AA of the substrate 111.

For example, in a case where the light blocking layer 115 is provided between the pixel driving circuit PDC and the planarization layer 113 so as to block light, the light blocking layer 115 may be disposed to cover all of the display area AA.

However, the present disclosure is not limited thereto. For example, the light blocking layer 115 provided between the pixel driving circuit PDC and the planarization layer 113 may be provided in only a region, corresponding to the pixel driving circuit PDC, of the substrate 111.

For example, the light blocking layer 115 provided between the pixel driving circuit PDC and the planarization layer 113 may cover all of the pixel driving circuit PDC.

Alternatively, the light blocking layer 115 provided between the pixel driving circuit PDC and the planarization layer 113 for blocking light may be provided to cover at least one of two or more transistors included in the pixel driving circuit PDC.

Referring to FIG. 3, the pixel driving circuit PDC may include a driving transistor Tdr which is connected to the pixel driving electrode AN, a switching transistor Tsw1 which is connected to a gate electrode of the driving transistor Tdr, a sensing transistor Tsw2 which is connected between the driving transistor Tdr and the pixel driving electrode AN, and an emission transistor Tsw3 which controls flowing of a current to the driving transistor Tdr.

In this case, the light blocking layer 115 provided between the pixel driving circuit PDC and the planarization layer 113 may be provided in at least one of a region between the switching transistor Tsw1 and the pixel driving electrode AN, a region between the sensing transistor Tsw2 and the pixel driving electrode AN, a region between the emission transistor Tsw3 and the pixel driving electrode AN, and a region between the driving transistor Tdr and the pixel driving electrode AN. Here, the pixel driving electrode AN may denote the first electrodes 150.

For example, as illustrated in FIG. 23, the light blocking layer 115 may be provided between the switching transistor Tsw1 and the pixel driving electrode AN and between the sensing transistor Tsw2 and the pixel driving electrode AN.

The reason that the light blocking layer 115 is not provided in the planarization layer 113 disposed between the driving transistor Tdr and the pixel driving electrode AN is because the mobility of the driving transistor Tdr is more enhanced by light leaked to a gap between the first electrodes 150. Also, the reason is because the emission efficiency of the light emitting device ED increases as the mobility of the driving transistor Tdr is enhanced. As described above, the light blocking layer 115 may not be provided between the driving transistor Tdr and the pixel driving electrode AN.

However, because a characteristic of each of the switching transistor Tsw1 and the sensing transistor Tsw2 should not be changed, the light blocking layer 115 may be disposed in a region corresponding to the switching transistor Tsw1 and the sensing transistor Tsw2.

That is, due to light leaked to a gap between the first electrodes 150, the light blocking layer 115 may not be provided in a transistor having an enhanced characteristic, but due to the light leaked to the gap between the first electrodes 150, the light blocking layer 115 may be provided in a transistor where a characteristic thereof should not be changed.

According to the embodiments of the present disclosure, only a first electrode corresponding to a region with particles located therein may be electrically disconnected from a pixel driving electrode, thereby preventing each pixel from being totally blackened by the particles.

Therefore, a yield rate of a light emitting display panel may be enhanced.

Moreover, in the present disclosure, a width of a connection electrode directly connected to a driving transistor configuring a pixel driving circuit among first electrodes may be set to be less than that of division electrodes. Also, a length of the connection electrode may be set to be long like a line, and thus, possibility that particles are provided on the connection electrode may be reduced. In this case, a division electrode with particles located thereon may be electrically disconnected from the other division electrodes by an aging process, and thus, a pixel may normally emit light by using the other division electrodes.

Moreover, in the present disclosure, light leaked from a light emitting layer to the pixel driving circuit through a gap between the first electrodes may be blocked by a light blocking layer, thereby reducing the quality degradation of a transistor due to leakage light.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display panel comprising:
 a substrate;
 a pixel driving circuit disposed on the substrate;
 a planarization layer disposed on the pixel driving circuit;
 a pixel driving electrode disposed on the planarization layer, the pixel driving electrode electrically connected to the pixel driving circuit;
 a light emitting layer disposed on the pixel driving electrode; and
 a common electrode disposed on the light emitting layer,
 wherein the pixel driving electrode comprises:
  a plurality of first electrodes spaced apart from one another; and
  a second electrode covering the plurality of first electrodes, and
  at least one of the second electrode or the plurality of first electrodes is connected to the pixel driving circuit,
 wherein the light emitting display panel comprises a plurality of pixels, and a plurality of first electrodes in a first pixel among the plurality of pixels and a plurality of first electrodes in a second pixel among the plurality of pixels are separated from each other.

2. The light emitting display panel of claim 1, wherein the second electrode comprises:
 a $2\text{-}1^{th}$ electrode disposed on the planarization layer; and
 a $2\text{-}2^{th}$ electrode disposed on a first electrode from the plurality of first electrodes, and
 the $2\text{-}1^{th}$ electrode and the $2\text{-}2^{th}$ electrode are connected to each other at a side surface of the first electrode.

3. The light emitting display panel of claim 1, wherein the second electrode is disconnected from at least one of the plurality of first electrodes and other first electrodes surrounding the at least one of the plurality of first electrodes.

4. The light emitting display panel of claim 1, wherein each of the plurality of first electrodes comprises:
 a $1\text{-}1^{th}$ electrode disposed on the planarization layer; and
 a $1\text{-}2^{th}$ electrode disposed on the $1\text{-}1^{th}$ electrode,
 wherein the second electrode comprises:
 a $2\text{-}1^{th}$ electrode disposed on the planarization layer; and
 a $2\text{-}2^{th}$ electrode disposed on the $1\text{-}2^{th}$ electrode, and
 the $2\text{-}1^{th}$ electrode is connected to the $2\text{-}2^{th}$ electrode through a corresponding first electrode from the plurality of first electrodes.

5. The light emitting display panel of claim 4, wherein the $2\text{-}1^{th}$ electrode is connected to the $1\text{-}1^{th}$ electrode, and the $2\text{-}2^{th}$ electrode is connected to the $1\text{-}2^{th}$ electrode.

6. The light emitting display panel of claim 5, wherein a side surface of the $2\text{-}1^{th}$ electrode is connected to a side surface of the $1\text{-}1^{th}$ electrode.

7. The light emitting display panel of claim 1, wherein the plurality of first electrodes comprise:
 a connection electrode connected to the pixel driving circuit; and
 a plurality of division electrodes spaced apart from one another.

8. The light emitting display panel of claim 7, wherein a width of the connection electrode is less than a width of each of the plurality of division electrodes, and a length of the connection electrode is longer than a length of each of the plurality of division electrodes.

9. The light emitting display panel of claim 8, wherein at least two of the plurality of division electrodes face the connection electrode in a lengthwise direction of the connection electrode.

10. The light emitting display panel of claim 1, wherein the planarization layer is a light blocking layer for performing a function of blocking light emitted from the light emitting layer.

11. The light emitting display panel of claim 10, wherein the planarization layer comprises a plurality of light blocking particles, each of the plurality of light blocking particles is a nano particle or a quantum dot including a metal material.

12. The light emitting display panel of claim 11, wherein the plurality of light blocking particles are provided in a whole display area of the substrate, or are provided in a region corresponding to the pixel driving circuit of the display area.

13. The light emitting display panel of claim 11, wherein the plurality of light blocking particles are provided to cover all of the pixel driving circuit, or are provided to cover at least one of two or more transistors included in the pixel driving circuit.

14. The light emitting display panel of claim 11, wherein the pixel driving circuit comprises:
- a driving transistor connected to the pixel driving electrode;
- a switching transistor connected to a gate electrode of the driving transistor; and
- a sensing transistor connected between the driving transistor and the pixel driving electrode, and
- wherein the plurality of light blocking particles are provided between the switching transistor and the pixel driving electrode and are provided between the sensing transistor and the pixel driving electrode.

15. The light emitting display panel of claim 1, further comprising a light blocking layer provided between the pixel driving circuit and the planarization layer.

16. The light emitting display panel of claim 15, wherein the light blocking layer is a silicon layer, a germanium layer, or a combination layer including a silicon layer and a germanium layer.

17. The light emitting display panel of claim 16, wherein the silicon layer is an amorphous silicon layer, and the germanium layer is an amorphous germanium layer.

18. The light emitting display panel of claim 15, wherein the light blocking layer is provided in a whole display area of the substrate or is provided in a region corresponding to the pixel driving circuit of the display area.

19. The light emitting display panel of claim 15, wherein the light blocking layer covers all of the pixel driving circuit, or covers at least one of two or more transistors included in the pixel driving circuit.

20. The light emitting display panel of claim 15, wherein the pixel driving circuit comprises:
- a driving transistor connected to the pixel driving electrode;
- a switching transistor connected to a gate electrode of the driving transistor; and
- a sensing transistor connected between the driving transistor and the pixel driving electrode,
- wherein the light blocking layer is provided between the switching transistor and the pixel driving electrode and is provided between the sensing transistor and the pixel driving electrode.

* * * * *